United States Patent
Kanbayashi et al.

(10) Patent No.: US 9,000,716 B2
(45) Date of Patent: Apr. 7, 2015

(54) HYBRID WORKING MACHINE AND ELECTRIC POWER ACCUMULATION CONTROLLER

(75) Inventors: Hideaki Kanbayashi, Kanagawa (JP); Tetsuji Ono, Kanagawa (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 761 days.

(21) Appl. No.: 13/144,216

(22) PCT Filed: Jan. 27, 2010

(86) PCT No.: PCT/JP2010/051027
§ 371 (c)(1),
(2), (4) Date: Jul. 12, 2011

(87) PCT Pub. No.: WO2010/087363

PCT Pub. Date: Aug. 5, 2010

(65) Prior Publication Data

US 2011/0273141 A1    Nov. 10, 2011

(30) Foreign Application Priority Data

Jan. 28, 2009 (JP) ................. 2009-016133
Feb. 18, 2009 (JP) ................. 2009-035779

(51) Int. Cl.
*H02J 7/14* (2006.01)
*E02F 9/20* (2006.01)
(Continued)

(52) U.S. Cl.
CPC ............... *E02F 9/2025* (2013.01); *B60K 6/48* (2013.01); *B60W 20/00* (2013.01);
(Continued)

(58) Field of Classification Search
CPC ... H02J 7/14; Y02T 10/7005; Y02T 10/7044; Y02E 60/12; E02F 9/2091
USPC .................... 320/104, 134, 152, 162
See application file for complete search history.

(56) References Cited

U.S. PATENT DOCUMENTS 7,482,779 B2    1/2009    Suzuki
2007/0159137 A1*   7/2007   Verbrugge et al. ............ 320/132
(Continued)

FOREIGN PATENT DOCUMENTS

GB    2461350    1/2010
JP    7-326548   12/1995
(Continued)

OTHER PUBLICATIONS

International Search Report mailed on Apr. 27, 2010.
(Continued)

*Primary Examiner* — Edward Tso
*Assistant Examiner* — Aaron Piggush
(74) *Attorney, Agent, or Firm* — IPUSA, PLLC

(57) ABSTRACT

A hybrid working machine includes a first electric motor performing a power running operation of being driven with supplied electric power and a regenerative operation of generating electric power; a first electric circuit controlling the output of the first electric motor; a battery supplying the first electric motor with the electric power and storing the regenerated electric power from the first electric motor; a charge and discharge circuit controlling the charging current and the discharge current of the battery; and a controller controlling the charge and discharge of the battery for driving the machine. The controller calculates a level representing a proportion by which the output of the battery is limited with respect to each of multiple conditions related to the output of the battery. The controller limits the charging current and the discharge current of the battery based on the calculated levels.

11 Claims, 18 Drawing Sheets

(51) Int. Cl.
*B60K 6/48* (2007.10)
*B66F 9/075* (2006.01)
*B66F 9/20* (2006.01)
*E02F 9/22* (2006.01)
*B60W 20/00* (2006.01)

(52) U.S. Cl.
CPC .............. *B66F 9/07572* (2013.01); *B66F 9/20* (2013.01); *E02F 9/2075* (2013.01); *E02F 9/2217* (2013.01); *H02J 7/14* (2013.01); *Y02T 10/6221* (2013.01)

(56) References Cited

U.S. PATENT DOCUMENTS

2007/0187180 A1    8/2007    Kagoshima et al.
2009/0033294 A1    2/2009    Odajima et al.

FOREIGN PATENT DOCUMENTS

| | | |
|---|---|---|
| JP | 2005-124353 | 5/2005 |
| JP | 2005-237178 | 9/2005 |
| JP | 2005-269825 | 9/2005 |
| JP | 2006-149181 | 6/2006 |
| JP | 2007-155586 | 6/2007 |
| JP | 2007-159280 | 6/2007 |
| JP | 2008-118790 | 5/2008 |
| JP | 2008-204962 | 9/2008 |
| JP | 2008-256673 | 10/2008 |

OTHER PUBLICATIONS

Japanese Office Action mailed on Sep. 4, 2012.

* cited by examiner

FIG.5

| TEMPERATURE | LEVEL |
|---|---|
| 0°C OR HIGHER | 0 |
| HIGHER THAN OR EQUAL TO Δ−10°C LOWER THAN 0°C | 1 |
| HIGHER THAN OR EQUAL TO Δ−20°C LOWER THAN −10°C | 2 |
| HIGHER THAN OR EQUAL TO Δ−30°C LOWER THAN −20°C | 3 |
| HIGHER THAN OR EQUAL TO Δ−40°C LOWER THAN −30°C | 4 |
| LOWER THAN Δ−40°C | 5 |

FIG.7

| FAILURE CONTENTS | FAILURE LOCATION | WARNING LEVEL |
|---|---|---|
| THERMISTOR WIRE BREAKAGE | (CONVERTER SIDE) | 1 |
| COOLING FAN MALFUNCTION | (MAIN CONTROL SIDE) | 2 |
| IMPROPER DATA ABNORMALITY | (MAIN CONTROL SIDE) | 0 |

※SELECT MAXIMUM VALUE IN CASE OF SIMULTANEOUS OCCURRENCE OF MULTIPLE FAILURES

HYBRID WORKING MACHINE AND ELECTRIC POWER ACCUMULATION CONTROLLER

TECHNICAL FIELD

The present invention relates to hybrid working machines and electric power accumulation controllers, and more particularly to a hybrid working machine that has kinetic energy or potential energy converted into electrical energy and stored in an electric power accumulation system, and uses the stored energy to drive a drive system, and to an electric power accumulation controller that controls electric power accumulation in such a working machine.

BACKGROUND ART

There are more and more hybrid automobiles and working machines used in construction work in order to address energy saving and environmental issues. In hybrid automobiles, an electric motor for traveling is driven with electric power from an electric power accumulator, and the electric power accumulator is charged with electricity generated by the power of an engine. In hybrid construction machines, an engine is assisted by having a motor generator driven with electric power from an electric power accumulator, and the motor generator is driven by the power of the engine to generate electricity to charge the electric power accumulator.

Since the electric power accumulator is repeatedly charged and discharged, the degradation of the electric power accumulator progresses as the electric power accumulator is used for a longer period of time. In the case of using a capacitor as the electric power accumulator, the progress of the degradation of the capacitor increases the internal resistance and the amount of heat generated, so that in the worst-case scenario, the electrodes may be short-circuited. If the electrodes of the capacitor are short-circuited, fusion cutting occurs so that the capacitor becomes unusable.

Further, the degradation of the capacitor is caused by long-term use with repeated charge and discharge, overcharge, overdischarge, or heat generation. The state of degradation of the capacitor may be determined by measuring the internal resistance of the capacitor. (See, for example, Patent Document 1.)

PRIOR ART DOCUMENTS

Patent Documents

[Patent Document 1] Japanese Laid-Open. Patent Application No. 2007-155586
[Patent Document 2] Japanese Laid-Open Patent Application No. 7-326548

SUMMARY OF THE INVENTION

Problems to be Solved by the Invention

The useful service life of the capacitor due to degradation depends on various factors other than time of use, such as outside air temperature. Therefore, the degree of degradation cannot be determined with accuracy based solely on time of use. If the determination of the degree of degradation is inaccurate, the capacitor may be used under the same conditions as in the normal state in spite of substantial progress in the degradation of the capacitor. In such a case, the capacitor is unduly loaded, so that the progress of the degradation of the capacitor is accelerated to put an early end to the serviceability of the capacitor.

Further, if the capacitor is charged or discharged in an overheated state, the degradation of the capacitor accelerates. Since the internal resistance of the capacitor increases in a low temperature state, it is not preferable to perform normal charge or discharge in a low temperature state.

The present invention is made in view of the above-described problems, and has an object of a hybrid working machine and an electric power accumulation controller capable of controlling the degradation of an electric power accumulator by controlling a charging/discharge current.

Means for Solving the Problems

According to one embodiment of the present invention, a hybrid working machine is provided that includes a first electric motor configured to perform a power running operation of being driven with supplied electric power and a regenerative operation of generating electric power; a first electric circuit configured to control an output of the first electric motor; a battery configured to supply the first electric motor with the electric power and to store the regenerated electric power from the first electric motor; a charge and discharge circuit configured to control a charging current and a discharge current of the battery; and a controller configured to control charge and discharge of the battery for driving the machine, wherein the controller is configured to calculate a level representing a proportion by which an output of the battery is limited with respect to each of multiple conditions related to the output of the battery, and to limit the charging current and the discharge current of the battery based on the calculated levels.

According to another embodiment of the present invention, an electric power accumulation controller configured to control charge and discharge of a battery for driving a machine is provided where a level representing a proportion by which an output of the battery is limited is calculated with respect to each of multiple conditions related to the output of the battery, and a charging current and a discharge current of the battery are limited based on the calculated levels.

Effects of the Invention

According to the present invention, it is possible to realize a hybrid working machine capable of controlling degradation by controlling the charging/discharge current of an electric power accumulator and of supplying electric power with stability.

BRIEF DESCRIPTION OF THE DRAWINGS

FIG. 5 is a diagram illustrating internal resistance value correction levels for outside air temperature ranges.

FIG. 7 is a diagram illustrating warning levels for failure contents.

DESCRIPTION OF EMBODIMENTS

Next, a description is given, with reference to the drawings, of embodiments of the present invention.

First, a description is given of a hybrid shovel as an example hybrid working machine to which the present invention is applied.

Figure 1:
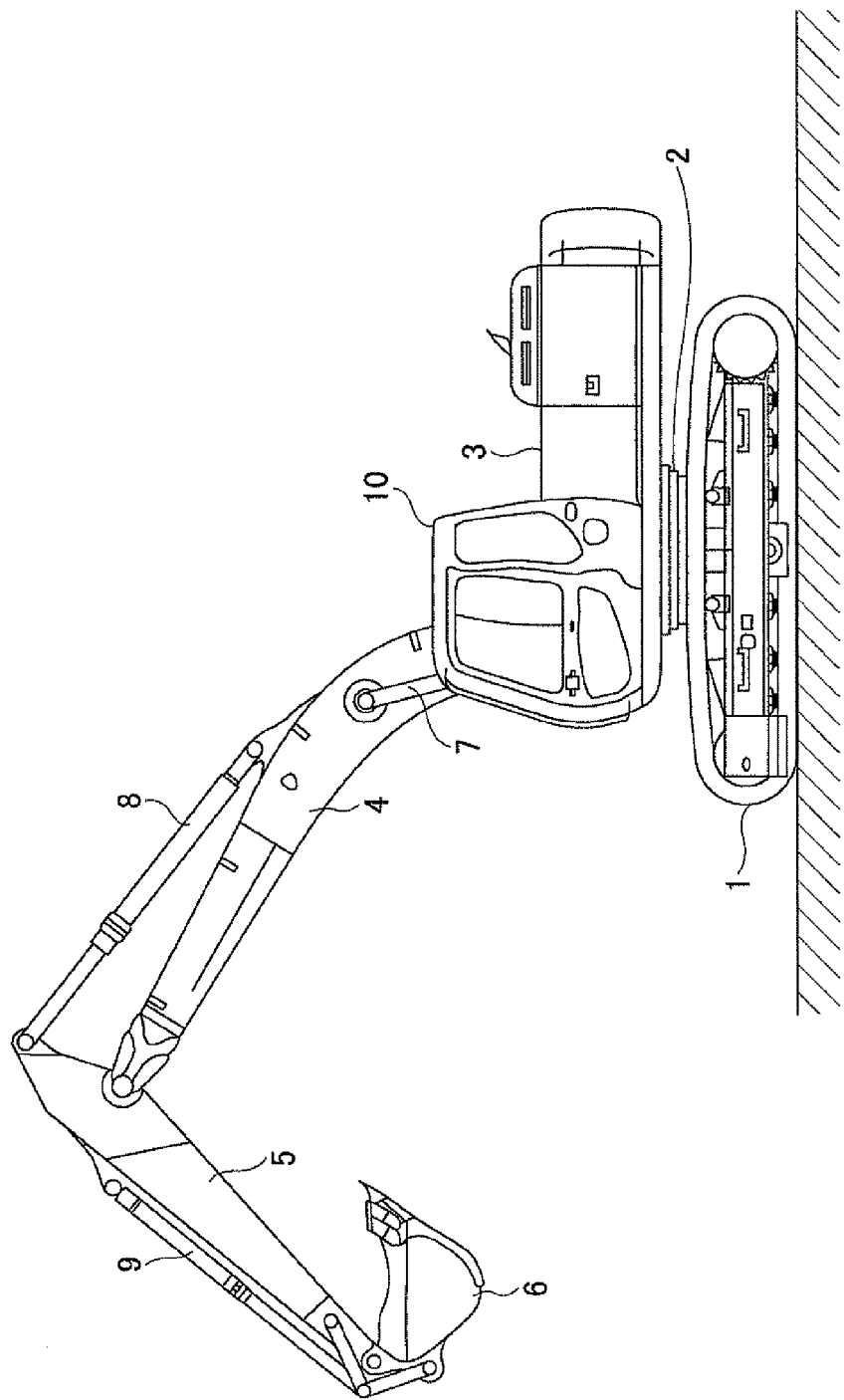
FIG. 1 is a side view of a hybrid shovel, which is an example of a hybrid working machine to which the present invention is applied.

FIG. 1 is a side view of a hybrid shovel. An upper-part turning body 3 is mounted through a turning mechanism 2 on a lower-part traveling body 1 of the shovel. A boom 4 extends from the upper-part turning body 3. An arm 5 is connected to the end of the boom 4. Further, a bucket 6 is connected to the end of the arm 5. The boom 4, the arm 5, and the bucket 6 are hydraulically driven by a boom cylinder 7, an arm cylinder 8, and a bucket cylinder 9, respectively. Further, a cabin 10 and power sources (not graphically illustrated) are mounted on the upper-part turning body 3.

Figure 2:
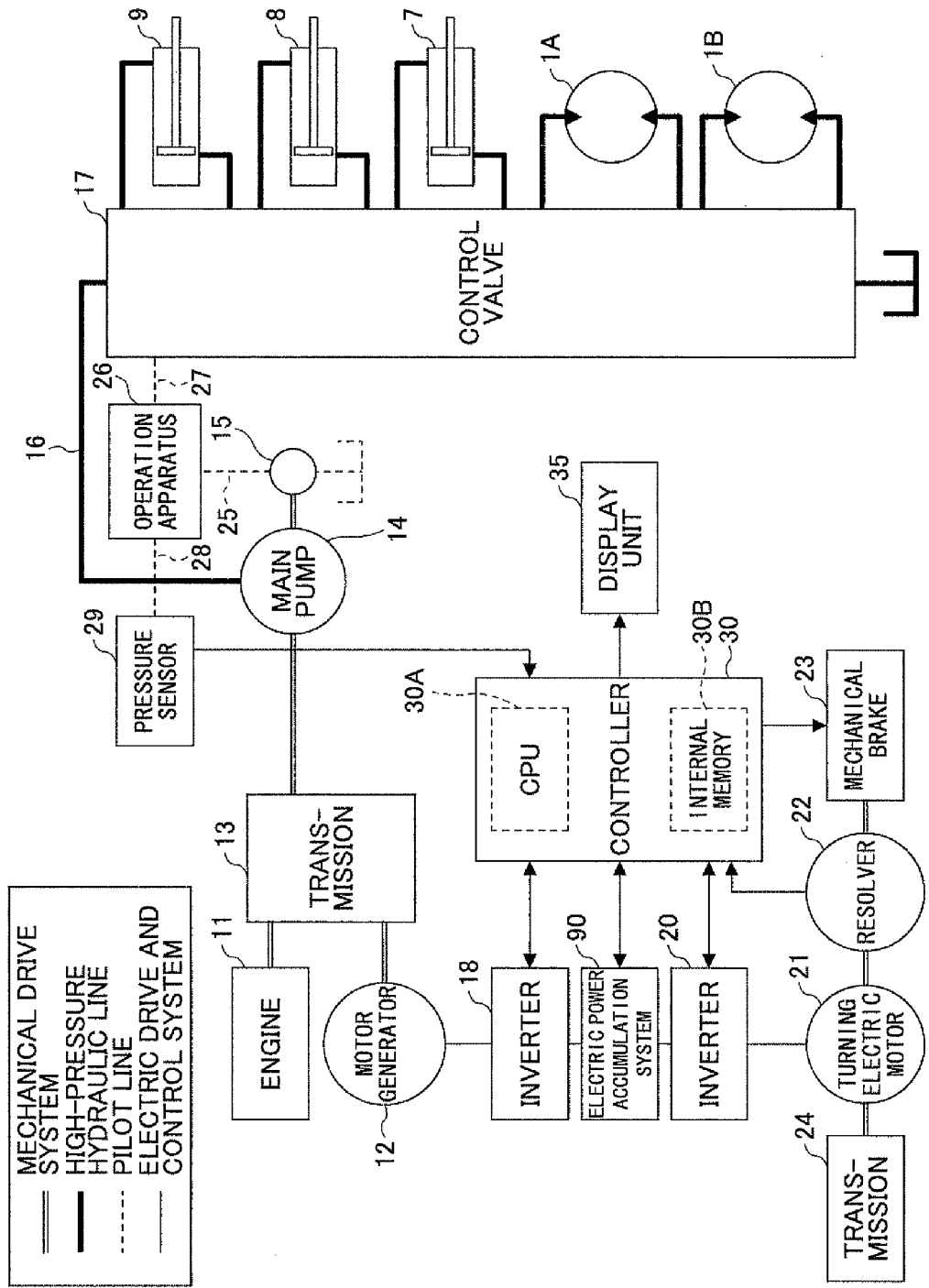
FIG. 2 is a functional block diagram of the hybrid shovel according to a first embodiment of the present invention.

FIG. 2 is a functional block diagram of the hybrid shovel illustrated in FIG. 1. In FIG. 2, a double line, a bold solid line, a fine solid line, and a broken line indicate a mechanical power system, a high-pressure hydraulic line, an electric system, and a pilot line, respectively.

As illustrated in FIG. 2, the drive shaft of an engine 1 is connected to an input shaft of a transmission 13. An engine that generates a driving force through combustion of fuel, for example, an internal combustion engine such as a diesel engine, is employed as the engine 11. The engine 11 is constantly operated during the operation of the working machine.

The drive shaft of a motor generator 12 is connected to another input shaft of the transmission 13. The motor generator 12 may perform both driving operations of a motor (assist) operation and a generator operation. For example, an IPM (Interior Permanent Magnet) motor having magnets embedded in a rotor is used as the motor generator 12.

The transmission 13 has the two input shafts and one output shaft. The drive shaft of the main pump 14 is connected to the output shaft of the transmission 13.

When the engine 11 is heavily loaded, the motor generator 12 performs the assist operation, so that the driving force of the motor generator 12 is transmitted to the main pump 14 via the transmission 13. As a result, the load applied on the engine 11 is reduced. On the other hand, when the engine 11 is lightly loaded, the driving force of the engine 11 is transmitted to the motor generator 12 via the transmission 13. As a result, the motor generator 12 is caused to perform the generator operation. The assist operation and the generator operation of the motor generator 12 are switched by an inverter 18 connected to the motor generator 12. The inverter 18 is controlled by a controller 30.

The controller 30 includes a central processing unit (CPU) 30A and an internal memory 30B. The CPU 30A executes a drive control program contained in the internal memory 30B. The controller 30 alerts the operator by displaying the state of degradation of various devices on a display unit 35.

The main pump 14 supplies a hydraulic pressure to a control valve 17 via a high-pressure hydraulic line 16. The control valve 17 distributes the hydraulic pressure to hydraulic motors 1A and 1B, the boom cylinder 7, the arm cylinder 8, and the bucket cylinder 9 based on instructions from the operator. The hydraulic motors 1A and 1B drive left and right crawlers, respectively, provided in the lower-part traveling body 1 illustrated in FIG. 1.

Input and output terminals of the electric system of the motor generator 12 are connected to an electric power accumulation system 90 via the inverter 18. The inverter 18 controls the operation of the motor generator 12 based on instructions from the controller 30. Further, a turning electric motor 21 is connected to the electric power accumulation system 90 via another inverter 20. The electric power accumulation system 90 and the inverter 20 are controlled by the controller 30.

During the assist operation of the motor generator 12, the motor generator 12 is supplied with necessary electric power from the electric power accumulation system 90. During the generator operation of the motor generator 12, the electric power accumulation system 90 is supplied with the electric power generated by the motor generator 12.

The turning electric motor 21, which is AC-driven based on a pulse width modulation (PWM) control signal from the inverter 20, may perform both operations of a power running operation and a regenerative operation. For example, an IPM motor is used for the turning electric motor 21. The IPM motor generates a large induced electromotive force at the time of regeneration.

During the power running operation of the turning electric motor 21, the rotating force of the turning electric motor 21 is transmitted via a transmission 24 to the turning mechanism 2 illustrated in FIG. 1. At this point, the transmission 24 reduces the rotational speed. As a result, the rotating force generated in the turning electric motor 21 increases to be transmitted to the turning mechanism 2. Further, at the time of the regenerative operation, the rotational movement of the upper-part turning body 3 is transmitted to the turning electric motor 21 via the transmission 24, so that the turning electric motor 21 regenerates electric power. At this point, contrary to the case of the power running operation, the transmission 24 increases the rotational speed. This makes it possible to increase the rpm of the turning electric motor 21.

A resolver 22 detects the position of the rotation shaft of the turning electric motor 21 in a rotational direction. The detection result is input to the controller 30. It is possible to determine the turning angle and the turning direction of the turning electric motor 21 by detecting the positions of the rotation shaft of the turning electric motor 21 in the rotational direction before and after its operation.

A mechanical brake 23, which is connected to the rotation shaft of the turning electric motor 21, generates a mechanical braking force. The mechanical brake 23 is switched between an applied state and a released state by an electromagnetic switch in response to the control of the controller 30.

A pilot pump 15 generates a pilot pressure necessary for a hydraulic operation system. The pilot pressure generated by the pilot pump 15 is supplied to an operation apparatus 26 via a pilot line 25. The operation apparatus 26 includes levers and pedals and is operated by the operator. The operation apparatus 26 converts a primary-side hydraulic pressure supplied through the pilot line 25 into a secondary-side hydraulic pressure in accordance with the operation of the operator. The secondary-side hydraulic pressure is transmitted to the control valve 17 via a hydraulic line 27 and also to a pressure sensor 29 via another hydraulic line 28.

The detection result of the pressure detected in the pressure sensor 29 is input to the controller 30. This allows the controller 30 to detect the operating conditions of the lower-part traveling body 1, the turning mechanism 2, the boom 4, the arm 5, and the bucket 6. In particular, in the hybrid working machine according to the embodiment of the present invention, not only the hydraulic motors 1A and 1B but also the turning electric motor 21 drives the turning mechanism 2. Therefore, it is desired to detect the amount of lever operations for controlling the turning mechanism 2 with high accuracy. The controller 30 may detect this amount of lever operations with high accuracy via the pressure sensor 29.

Further, the controller 30 may also detect a state where none of the lower-part traveling body 1, the turning mechanism 2, the boom 4, the arm 5, and the bucket 6 is operated and neither supplying the electric power accumulation system 90 with electric power nor forcible extraction of electric power from the electric power accumulation system 90 is performed (a non-operating state).

Figure 3:
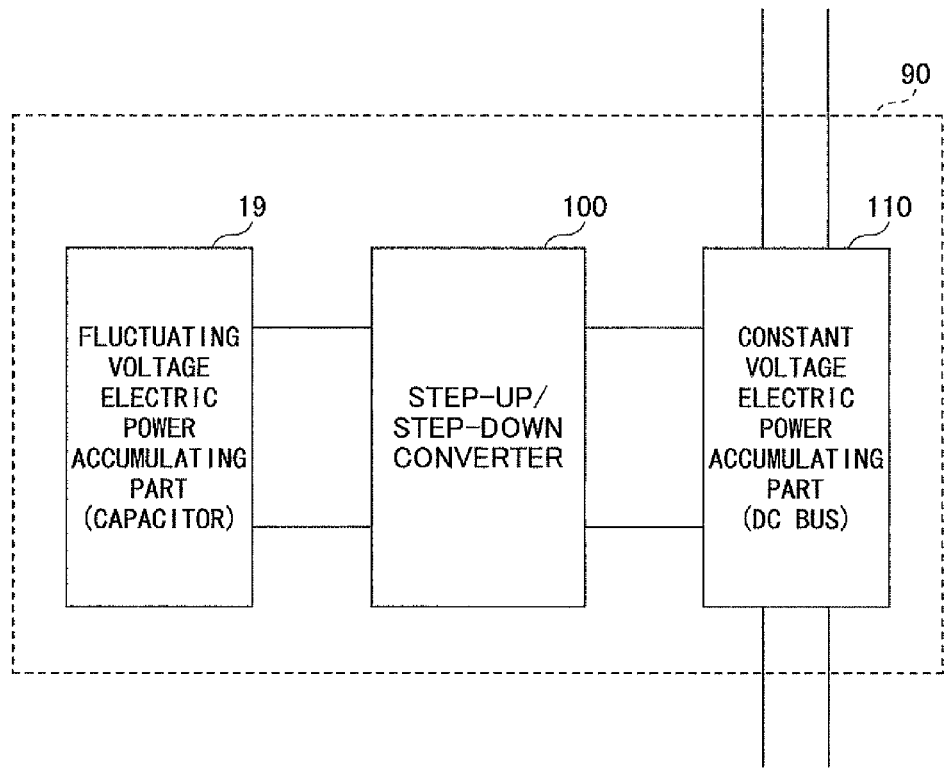
FIG. 3 is a block diagram of an electric power accumulation system.

FIG. 3 is a block diagram of the electric power accumulation system 90. The electric power accumulation system 90 includes a battery (capacitor) 19 as a fluctuating voltage electric power accumulating part. In this embodiment, a capacitor (an electric double layer capacitor) is used as the battery. The battery, however, is not limited to a capacitor and may be any battery as long as the battery may be repeatedly charged and discharged. The capacitor 19 is connected via a step-up/step-down converter 100 to a DC bus 110, which is a constant voltage electric power accumulating part. The inverters 18 and 20 are connected to the DC bus 110.

In FIG. 2, the controller 30 operates as an electric power accumulation controller according to the first embodiment of the present invention. The controller 30 is connected to the electric power accumulation system 90 (the step-up/step-down converter 100), and controls the charging/discharge current of the capacitor 19 to control the degradation of the capacitor 19.

Here, a description is given of the drive control of the above-described hybrid shovel.

The above-described boom cylinder 7, arm cylinder 8, bucket cylinder 9, and hydraulic motors 1A and 1B for traveling correspond to hydraulic loads driven with the hydraulic pressure from the main pump 14. The engine 11 supplies power to the main pump 14, which is a hydraulic pump, to drive the main pump 14, and the power generated by the engine 11 is converted into a hydraulic pressure by the main pump 14 to be supplied to the hydraulic loads.

Electrical loads, which correspond to components driven with electric power, such as an electric motor and an electric actuator, include the above-described turning electric motor 21. The electrical loads are supplied with electric power from the battery 19 via the converter 100 to be driven. The power running operation refers to the case where an electrical load is being driven. Examples of electrical loads include those capable of regenerating electric power, such as an electric motor and generator. The regenerated electric power is supplied to the DC bus 110 of the electric power accumulation system 90 to be stored in the capacitor 19 via the converter 100 or be supplied to the motor generator 12 via the inverter 18 to serve as electric power to drive the motor generator 12.

As described above, the capacitor 19 of the electric power accumulation system 90 is charged with the regenerated electric power from electrical loads. Further, when the motor generator 12 receives power from the engine 11 to operate as a generator, the capacitor 19 of the electric power accumulation system 90 may be supplied and charged with the electric power generated by the motor generator 12. In this embodiment, an electric double layer capacitor is used as the capacitor 19, which is an example of the battery.

In the hybrid shovel subjected to the above-described drive control, the controller 30, which operates as an electric power accumulation controller, controls the progress of the degradation of the capacitor 19 in the electric power accumulation system 90 by controlling the charging/discharge current of the capacitor 19. Specifically, the controller 30, which operates as an electric power accumulation controller, limits the charging/discharge current in consideration of multiple conditions related to the output of the capacitor 19, thereby reducing a load applied on the capacitor 19 when the capacitor 19 is charged or discharged to prevent the occurrence of an abnormality in the apparatus and control the progress of the degradation of the capacitor 19.

Here, the multiple control information items to be considered include the following four information items.

(a) Internal Resistance

In the case of operating the hybrid hydraulic shovel in cold climates or the like, the temperature of the capacitor 19 becomes low so that the internal resistance of the capacitor 19 increases accordingly. Causing a large current to flow through the capacitor 19 in this state increases the loss of the capacitor 19 as well as error in SOC measurement. Therefore, it is desirable to limit the charging/discharge current of the capacitor 19.

(b) Operating Condition Setting

For example, based on a service person's decision or at a user's request, such a setting may be provided as to limit the output of the capacitor 19.

(c) Degradation Condition (Degradation Index)

As the total time of use becomes longer, the number of times the capacitor 19 is charged and discharged increases, so that the capacitor 19 degrades. The degradation of the capacitor 19 increases its internal resistance, and the amount of heat generated by the capacitor 19 increases accordingly. The temperature increase of the capacitor 19 is one of the main reasons for its degradation. The temperature increase progresses to cause further degradation. This results in an increase in the internal resistance and causes reduction in capacitance. The degradation index is determined in consideration of these.

(d) Failure Condition

Even if a failure occurs in some part of the hybrid shovel, it may be possible to continue the operation of the hybrid shovel depending on the kind or degree of the failure. If the capacitor 19 is given a normal charge or discharge in such a condition, the failure worsens in degree or the load applied on the capacitor 19 increases, so that the progress of the degradation accelerates.

In this embodiment, the controller 30 limits the output of the capacitor 19 in consideration of the above-described four conditions, thereby controlling the progress of the degradation of the capacitor 19 and controlling the operation of the hybrid shovel so that there is no occurrence of an operational abnormality and the capacitor 19 has as long a useful service life as possible.

Figure 4:
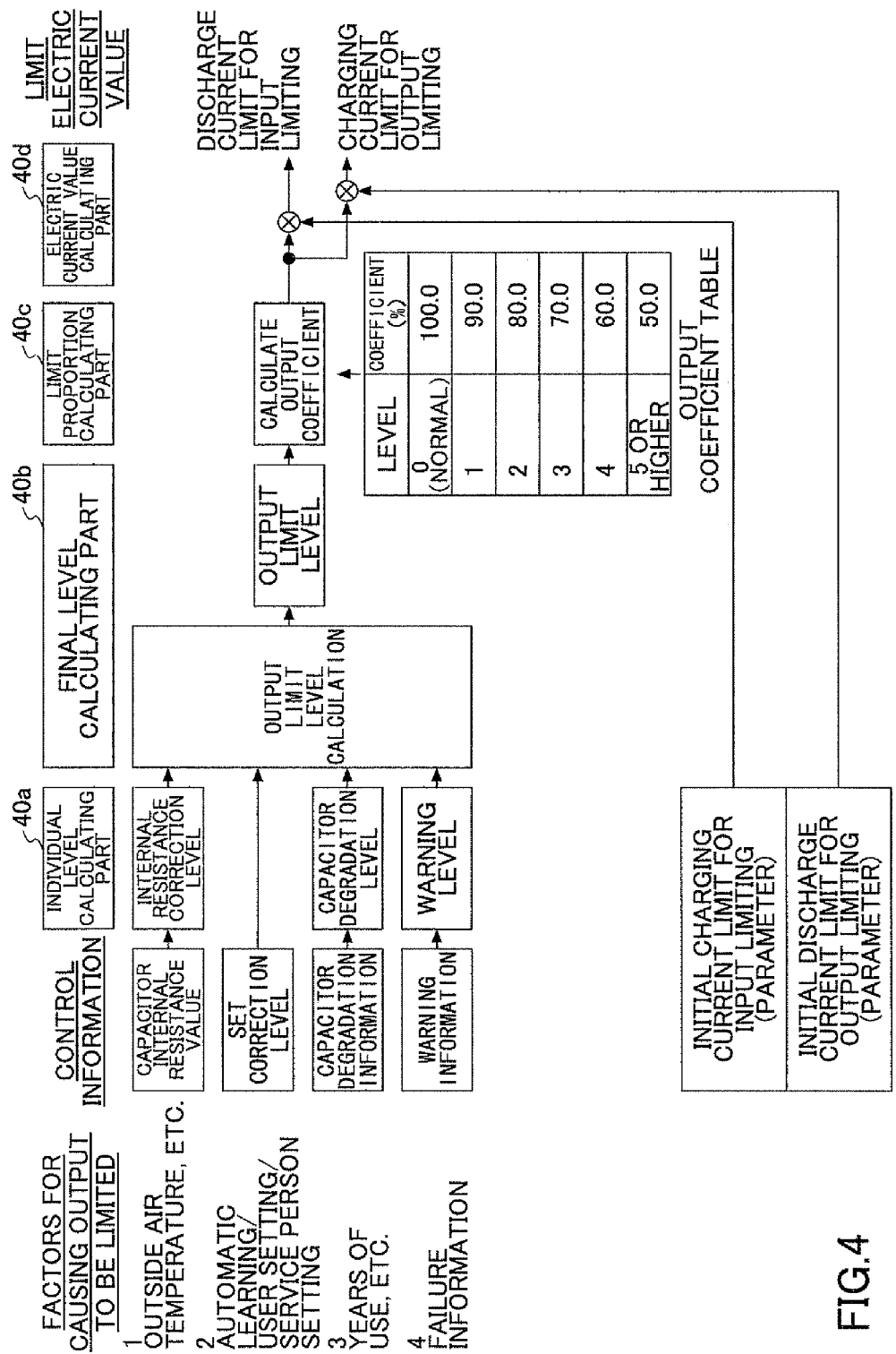
FIG. 4 is a functional block diagram of a controller that operates as an electric power accumulation controller according to the first embodiment of the present invention.

FIG. 4 is a functional block diagram of the controller 30, which operates as an electric power accumulation controller. Control information related to the above-described four conditions is input to the controller 30.

First, the internal resistance value of the capacitor 19 is input to the controller 30 as the (a) control information. An individual level calculating part 40a of the controller 30 calculates an internal resistance correction level from the internal resistance value of the capacitor 19, and supplies a final level calculating part 40b with the calculated internal resistance correction level. It is preferable to use an actual measurement for the internal resistance value. If it is not possible to do so, however, the level may be estimated from an outside air temperature and be thus determined in a simplified manner.

As illustrated in FIG. 5, the internal resistance correction level is set in accordance with the range of outside air temperatures. For example, the internal resistance correction level is determined as: LEVEL 0 if the outside air temperature is higher than or equal to 0° C., LEVEL 1 if the outside air temperature is higher than or equal to −10° C. and lower than 0° C., LEVEL 2 if the outside air temperature is higher than or equal to −20° C. and lower than −10° C., LEVEL 3 if the outside air temperature is higher than or equal to −30° C. and lower than −20° C., LEVEL 4 if the outside air temperature is higher than or equal to −40° C. and lower than −30° C., and LEVEL 5 if the outside air temperature is lower than −40° C. The range of outside air temperatures and the value of the determined level are not limited to those illustrated in FIG. 5, and temperature ranges and corresponding level values may be suitably determined.

Next, as the (b) control information representing the setting of an operating condition, a set correction level is directly input to the electric power accumulation controller. Therefore, there is no need to calculate a level. The set correction level as control information representing the setting of an operating condition is supplied to the final level calculating part 40b.

Further, the (c) capacitor degradation information (degradation index) is input to the controller 30. The individual level calculating part 40b of the controller 30 calculates a capacitor degradation level from the degradation information of the capacitor 19, and supplies the calculated degradation level to the final level calculating part 40b.

Figure 6:
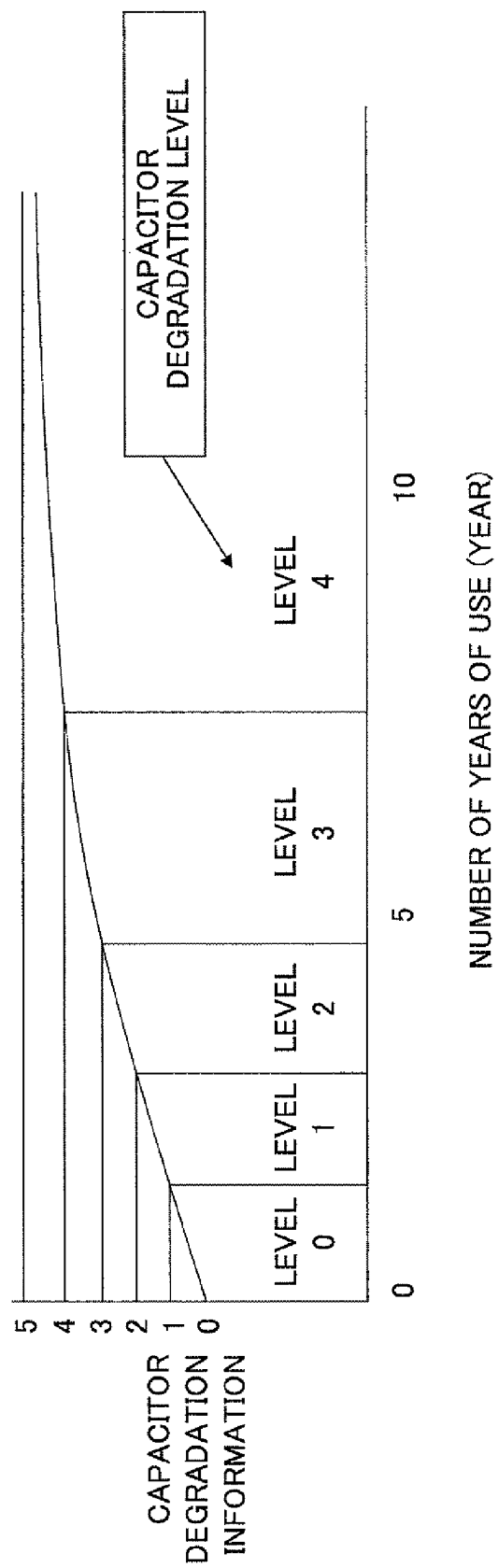
FIG. 6 is a graph illustrating the relationship between the time of use and the internal resistance of a capacitor.

For example, an increase in the internal resistance value of the capacitor 19 may be measured as the capacitor degradation information, and the degradation level may be defined in accordance with the increase. Further, in the case of also measuring a decrease in capacitance, the decrease in capacitance may also be taken into consideration. Further, if it is not possible to measure the internal resistance, the degradation level may be estimated based on the number of years of use. In this case, it is known that there is a relationship as illustrated in the graph of FIG. 6 between the total time of use (the number of years of use) and the internal resistance of a capacitor, and the internal resistance increases as the number of years of use of the capacitor increases. Accordingly, the degree of degradation of the capacitor 19 may be estimated from its internal resistance. Further, a measurement of capacitance may be used for the degradation condition.

In this embodiment, as illustrated in the graph of FIG. 6, the degradation level is determined as: LEVEL 0 if the internal resistance of the capacitor 19 is less than 1 in resistance value, LEVEL 1 if the internal resistance of the capacitor 19 is more than or equal to 1 and less than 2 in resistance value, LEVEL 2 if the internal resistance of the capacitor 19 is more than or equal to 2 and less than 3 in resistance value, LEVEL 3 if the internal resistance of the capacitor 19 is more than or equal to 3 and less than 4 in resistance value, and LEVEL 4 if the internal resistance of the capacitor 19 is more than or equal to 4 in resistance value. Resistance values may be specific numerical values or be expressed by their proportions % to an initial resistance value, letting the initial resistance value be 100%. For example, in FIG. 6, letting Initial Resistance Value 0 be 100%, Resistance Value 1 may be determined as 120%, Resistance Value 2 may be determined as 135%, Resistance Value 3 may be determined as 150%, Resistance Value 4 may be determined as 160%, and Resistance Value 5 may be determined as 180%. The range of internal resistance and the value of the determined level are not limited to those illustrated in FIG. 6, and internal resistance value ranges and corresponding degradation level values may be suitably determined.

Further, as the (d) control information representing a failure condition, warning information is input to the electric power accumulation controller. The individual level calculating part 40a of the controller 30 calculates a warning level from the warning information, and supplies the calculated warning level to the final level calculating part 40b.

The control information representing a failure condition, which is input from a control part that controls the operation of the hybrid shovel, relates to such minor failures as to allow the operation of the hybrid shovel to be continued as described above. Examples of such minor failures include failures as illustrated in FIG. 7. Minor failures also have the degree of importance, and a warning level is set for each failure. In this embodiment, for example, WARNING LEVEL 0 is set for the failure that the data of a main control part present an abnormality, WARNING LEVEL 1 is set for the failure that a wire breakage has occurred in a thermistor for detecting the temperature of each part of the hybrid hydraulic shovel, and WARNING LEVEL 2 is set for the failure that a capacitor cooling fan has malfunctioned. In the case of the simultaneous occurrence of multiple failures, a maximum value is selected from among the warning levels corresponding to the contents of the respective failures. The contents of a failure and the value of a warning level are not limited to those illustrated in FIG. 7. Warning levels may be suitably determined in consideration of the contents of failures and the effects of the failures.

The final level calculating part 40b calculates the output limit level of the battery 19 based on the supplied internal resistance correction level, set correction level, degradation level, and warning level. In this embodiment, the total value of the internal resistance correction level, the set correction level, the degradation level, and the warning level is determined as the output limit level. The calculated output limit level is supplied to a limit proportion calculating part 40c of the controller 30.

The limit proportion calculating part 40c of the controller 30 calculates an output coefficient from the value of the output limit level supplied from the final level calculating part 40b. As illustrated in FIG. 4, an output coefficient corresponding to the value of the output limit level may be determined from an output coefficient table. The limit proportion calculating part 40c supplies the calculated output coefficient to an electric current value calculating part 40d.

The electric current value calculating part 40d of the controller 30 calculates a charging current limit value for input limiting by multiplying an initial charging current limit value for input limiting by the output coefficient, and outputs the calculated charging current limit value for input limiting to the step-up/step-down converter 100 of the electric power accumulation system 90. The initial charging current limit value for input limiting, which is a value set by a parameter, is a charging current value indicating the maximum value (that is, limit value) of a charging current to the capacitor 19. The step-up/step-down converter 100 performs control so that the charging current to the capacitor 19 is less than or equal to the charging current limit value for current input limiting. Further, the electric current value calculating part 40d calculates a discharge current limit value for output limiting by multiplying a discharge current limit value for output limiting by the output coefficient, and outputs the calculated discharge current limit value for output limiting to the step-up/step-down converter 100 of the electric power accumulation system 90. The discharge current limit value for output limiting is a discharge current value indicating the maximum value (that is, limit value) of a discharge current from the capacitor 19. The step-up/step-down converter 100 performs control so that the discharge current from the capacitor 19 is less than or equal to the discharge current limit value for output limiting.

Thus, according to this embodiment, a current limit level is determined independently for each of the four factors of (a) the internal resistance, (b) the operating condition setting, (c) the degradation level, and (d) the failure condition, and a final current limit level is determined by summing up the current limit levels obtained from the respective four factors. By limiting the charging/discharge current in accordance with this final current limit level, it is possible to reduce a load applied on the capacitor 19 so that it is possible to retard progress in the degradation of the capacitor 19 and prolong its useful service life and also to prevent the occurrence of an abnormality in the apparatus.

Figure 8:
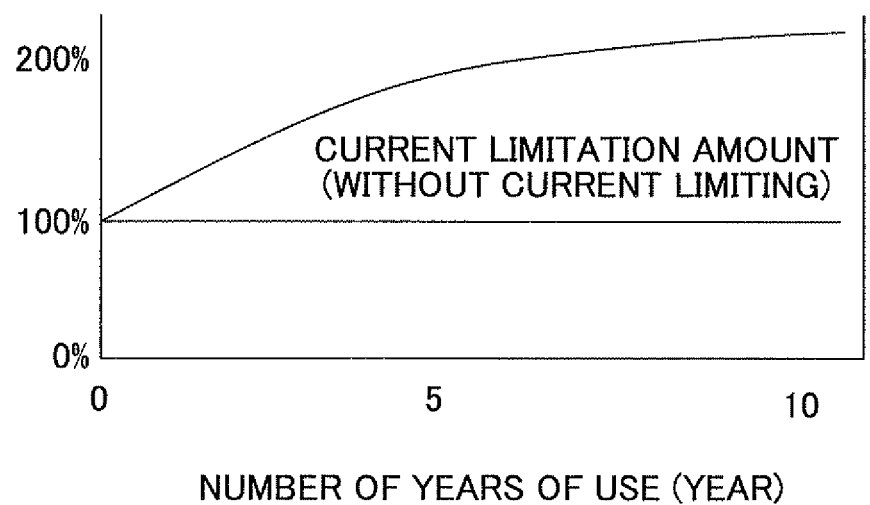
FIG. 8 is a graph illustrating the progress of the degradation of the capacitor in the case where a maximum charging/discharge current remains the same in magnitude as at a time when the capacitor is in its initial condition in spite of progress in the degradation of the capacitor.
Figure 9:
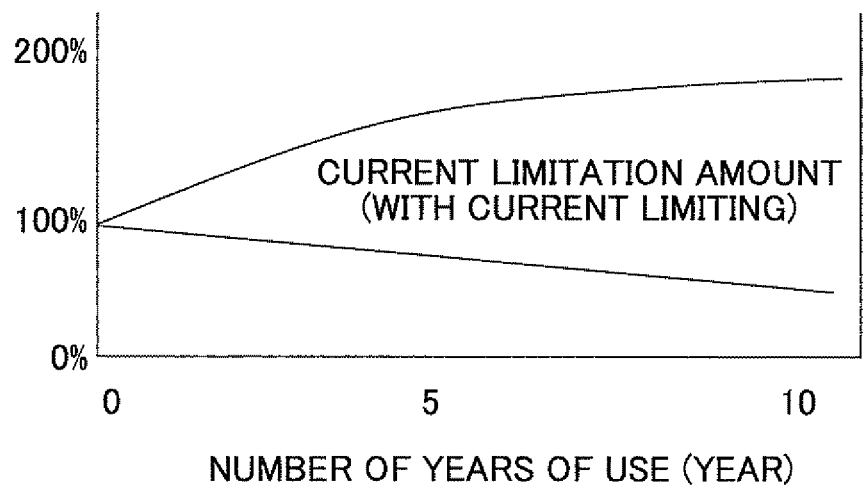
FIG. 9 is a graph illustrating the progress of the degradation of the capacitor in the case where the maximum charging/discharge current is limited and reduced as the time of use increases.

Here, a description is given, taking the (c) time-of-use factor as an example, of the degree of progress of the degradation of the capacitor 19 and the current limit level. The progress of the degradation of the capacitor 19 differs between the case where the maximum charging/discharge current remains the same in magnitude as at the time when the capacitor 19 is in its initial condition in spite of progress in the degradation of the capacitor 19 as illustrated in FIG. 8 (that is, the case where the amount of current limitation is constant) and the case where the maximum charging/discharge current is limited and reduced as the time of use increases as illustrated in FIG. 9 (that is, in the case of increasing the amount of current limitation). The progress of the degradation is slower and the useful service life of the capacitor 19 can be longer in the case of increasing the amount of current limitation as the time of use increases (that is, performing current limiting) than in the case where the amount of current limitation is constant (that is, performing no current limiting). In this embodiment, the progress of the degradation of a capacitor is controlled by limiting a charging/discharge current value in accordance with the degree of degradation of the capacitor and the condition of the capacitor in consideration of the relationship between the magnitude of the current value of the capacitor and the progress of the degradation of the capacitor as described above.

Next, a description is given of the transition of the output limit level in some example operations.

Figure 10:
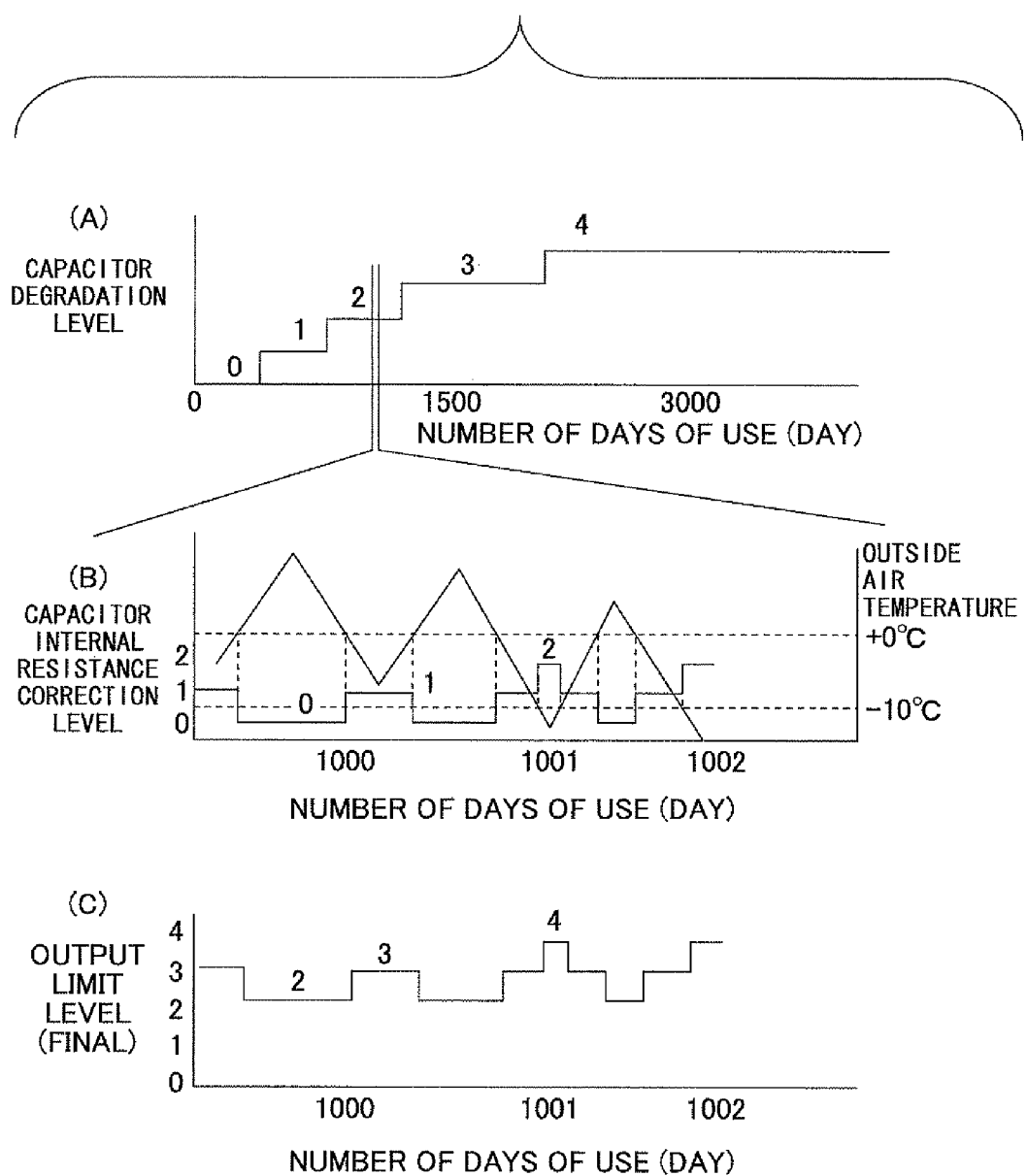
FIG. 10 shows graphs illustrating a transition of an output limit level in the case of operating the hybrid hydraulic shovel where the hybrid hydraulic shovel has been used for years and the outside air temperature is low.

FIG. 10 shows graphs illustrating the transition of the output limit level in the case of operating the above-described hybrid hydraulic shovel where the hybrid hydraulic shovel has been used for years (the capacitor 19 is degraded to some extent) and the outside air temperature is low. In FIG. 10, (A) is a graph illustrating the progress of the degradation of the capacitor 19, showing that the degradation level proceeds stepwise from LEVEL 0 to LEVEL 4 as the number of days of use increases. Here, this example operation is the case of an operation over a few days after the capacitor 19 has been used for approximately 1000 days.

In FIG. 10, (B) is a graph illustrating the transition of the internal resistance correction level of the capacitor 19 in the operation of the few days. In the graph, changes in the outside air temperature are shown, and +0° C. and −10° C. are indicated by dotted lines as temperatures for switching the internal resistance correction level. The internal resistance correction level is 0 if the outside air temperature is higher than or equal to the switch temperature of +0° C. The internal resistance correction level is 1 if the outside air temperature is lower than the switch temperature of +0° C. and higher than or equal to the switch temperature of −10° C. Further, the internal resistance correction level is 2 if the outside air temperature is lower than the switch temperature of −10° C. Thus, since the internal resistance increases as the outside air temperature decreases, the internal resistance correction level also becomes higher as the outside air temperature decreases.

In FIG. 10, (C) is a graph illustrating the transition of the output limit level in the few days illustrated in (B). As illustrated in (A) of FIG. 10, in these few days, the degradation level of the capacitor 19 is 2, and the internal resistance correction level varies between 0 and 2 with changes in the outside air temperature. Accordingly, the output limit level is the total value of the degradation level and the internal resistance correction level, and varies between 2 and 4 as illustrated in (C) of FIG. 10.

For example, around noon on the $1000^{th}$ day, the outside air temperature rises above 0° C., so that the internal resistance correction level is 0. Therefore, the output limit level, which is the sum of the internal resistance correction level of 0 and the degradation level of 2, is LEVEL 2. At night on the $1000^{th}$ day, the outside air temperature falls below 0° C., so that the internal resistance correction level is 1. Therefore, the output limit level, which is the sum of the internal resistance correction level of 1 and the degradation level of 2, is LEVEL 3. Further, on the morning of the $1001^{st}$ day, the outside air temperature further falls to be lower than −10° C., so that the internal resistance correction level is 2. Therefore, the output limit level, which is the sum of the internal resistance correction level of 2 and the degradation level of 2, is LEVEL 4. Thus, while the degradation level remains constant in a short period, the internal resistance correction level varies with the daily change of the outside air temperature, with which the output limit level also changes.

Figure 11:
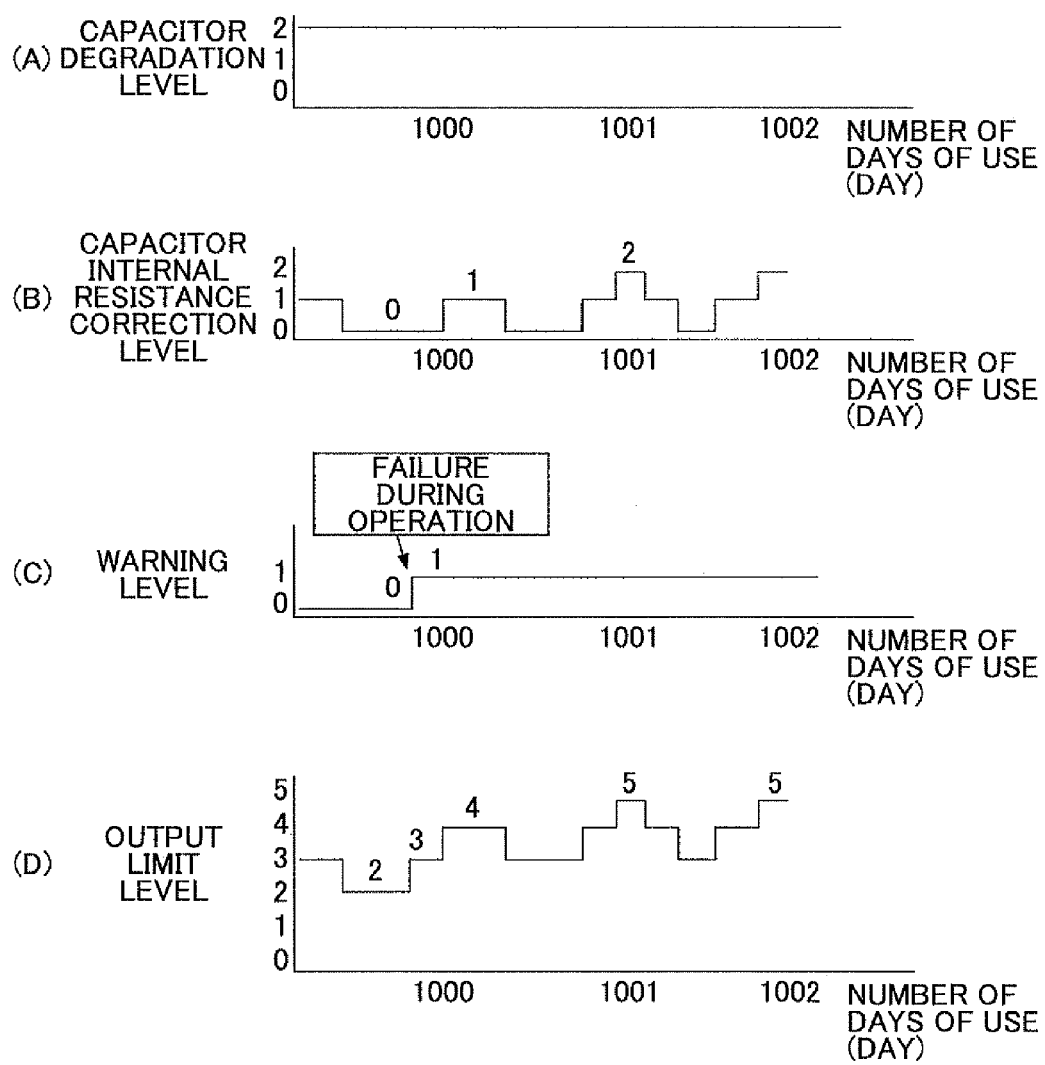
FIG. 11 shows graphs illustrating a transition of the output limit level in the case of operating the hybrid hydraulic shovel with the occurrence of a minor failure under the operating conditions illustrated in FIG. 10.

FIG. 11 shows graphs illustrating the transition of the output limit level in the case of operating the above-described hybrid shovel with the occurrence of a minor failure under the operating conditions illustrated in FIG. 10. In FIG. 11, (A) is a graph illustrating the degradation level of the capacitor 19.

As illustrated in (A) of FIG. 11, the degradation level is 2. In FIG. 11, (B) is a graph illustrating the internal resistance correction level, and is the same as the graph illustrated in (B) of FIG. 10.

In FIG. 11, (C) is a graph illustrating a warning level, and indicates a change in the warning level from 0 to 1 due to the occurrence of a failure on the morning of the $1000^{th}$ day. This is such a minor failure as to allow the operation of the hybrid hydraulic shovel to be continued.

In FIG. 11, (D) is a graph illustrating the transition of the output limit level. In these few days, the degradation level of the capacitor 19 is 2 as illustrated in (A) of FIG. 11, the internal resistance correction level varies between 0 and 2 with changes in the outside air temperature, and the warning level has been changed from 0 to 1. Accordingly, the output limit level is the total value of the degradation level, the internal resistance correction level, and the warning level, and varies between 2 and 5 as illustrated in (D) of FIG. 11. Particularly, after the occurrence of the failure, the warning level is raised by one so that the output limit level also is raised as a whole by one to vary between 3 and 5.

Figure 12:
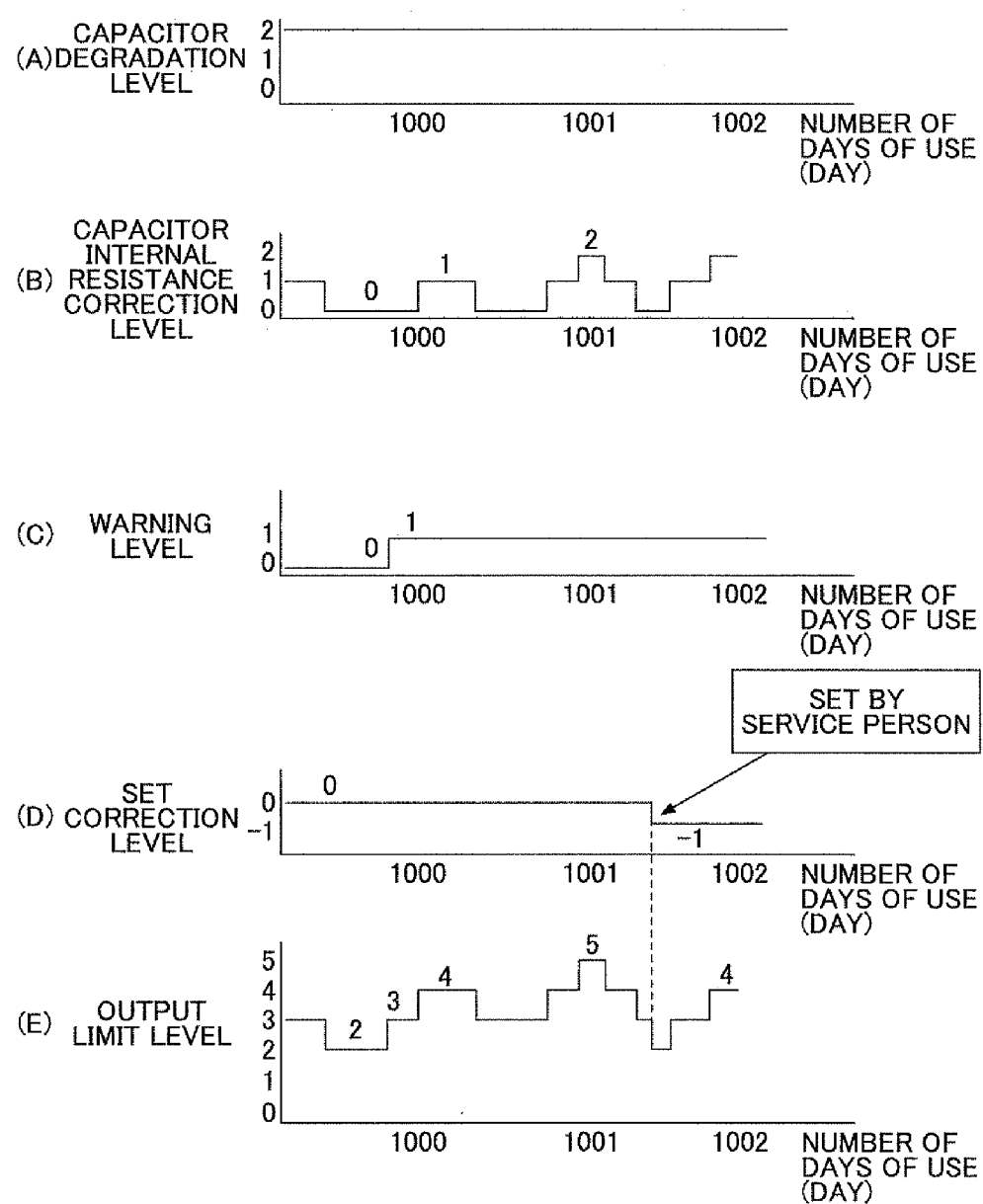
FIG. 12 shows graphs illustrating a transition of the output limit level in the case of changing and lowering a correction level by a serviceperson after the occurrence of the minor failure under the operating conditions illustrated in FIG. 11.

FIG. 12 shows graphs illustrating the transition of the output limit level in the case of changing and lowering the correction level by a service person after the occurrence of the minor failure under the operating conditions illustrated in FIG. 11. In FIG. 12, (A) is a graph illustrating the degradation level of the capacitor 19. As illustrated in (A) of FIG. 12, the degradation level is 2. In FIG. 12, (B) is a graph illustrating the internal resistance correction level, and is the same as the graph illustrated in (B) of FIG. 11. In FIG. 12, (C) is a graph illustrating the warning level, and is the same as the graph illustrated in (C) of FIG. 11.

In FIG. 12, (D) is a graph illustrating the correction level. After the occurrence of a failure, around noon on the $1001^{st}$ day, a service person makes a check and determines that there is no effect due to this failure to lower the set correction level by one to −1. That is, based on the determination that making normal use of the battery 19 with this failure neither deteriorates the failure nor accelerates the degradation of the capacitor 19, the set correction level is lowered so as to cancel a rise in the output limit level due to a rise in the warning level caused by the occurrence of the failure.

In FIG. 12, (E) is a graph illustrating the transition of the output limit level. In these few days, the degradation level of the capacitor 19 is 2 as illustrated in (A) of FIG. 12, the internal resistance correction level varies between 0 and 2 with changes in the outside air temperature, the warning level is changed from 0 to 1, and the correction level is thereafter changed from 0 to −1. Accordingly, the output limit level is the total value of the degradation level, the internal resistance correction level, the warning level, and the set correction level, and varies between 2 and 5 as illustrated in (E) of FIG. 12. Particularly, after the occurrence of the failure, the warning level is raised by one so that the output limit level also is raised as a whole by one to vary between 3 and 5. Since the service person thereafter lowers the set correction level by one, the output limit level also is lowered as a whole by one to vary between 2 and 4.

As described above, an electric power accumulation controller according to this embodiment calculates a level representing a proportion by which to limit the output of a battery (for example, a capacitor) with respect to each of multiple conditions related to the output of the battery, and limits the charging/discharge current of the battery based on the calculated levels. Thereby, the electric power accumulation controller controls the progress of the degradation of the battery, and controls the operation of the hybrid shovel so that the battery has as long a useful service life as possible.

The above description of the first embodiment is given, taking a hybrid shovel as an example, while the present invention may also be applied to other working machines or to machines other than working machines. Examples of other working machines to which the control method executed by the electric power accumulation controller according to the present invention may be applied include a forklift as illustrated in FIG. 13.

Figure 13:
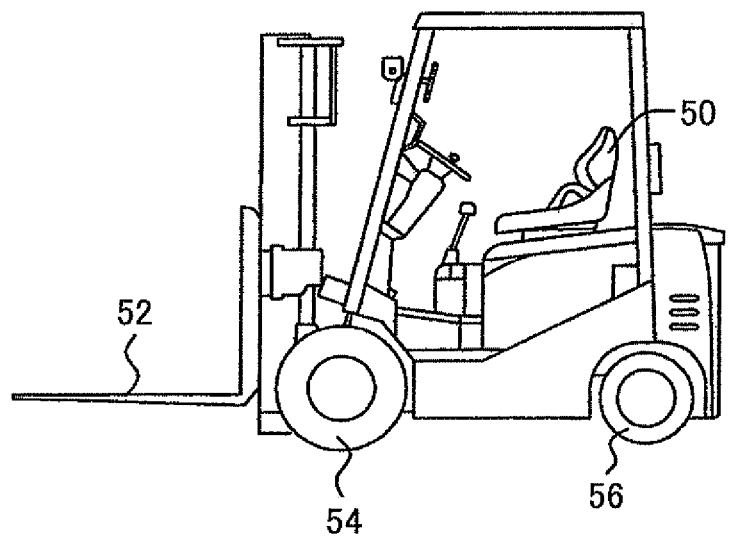
FIG. 13 is a side view of a forklift as an example of a working machine to which the present invention may be applied.

The forklift illustrated in FIG. 13 includes a driver's seat 50 for an operator to climb into and ride in, forks 52 for lifting loads, and front wheels 54 and rear wheels 56 for traveling. The forks 52 are driven by a cargo handling motor (not graphically illustrated) to move up and down. Further, the front wheels 54 are drive wheels and are driven by a traveling motor (not graphically illustrated). The cargo handling motor and the traveling motor are driven with electric power from a battery.

Figure 14:
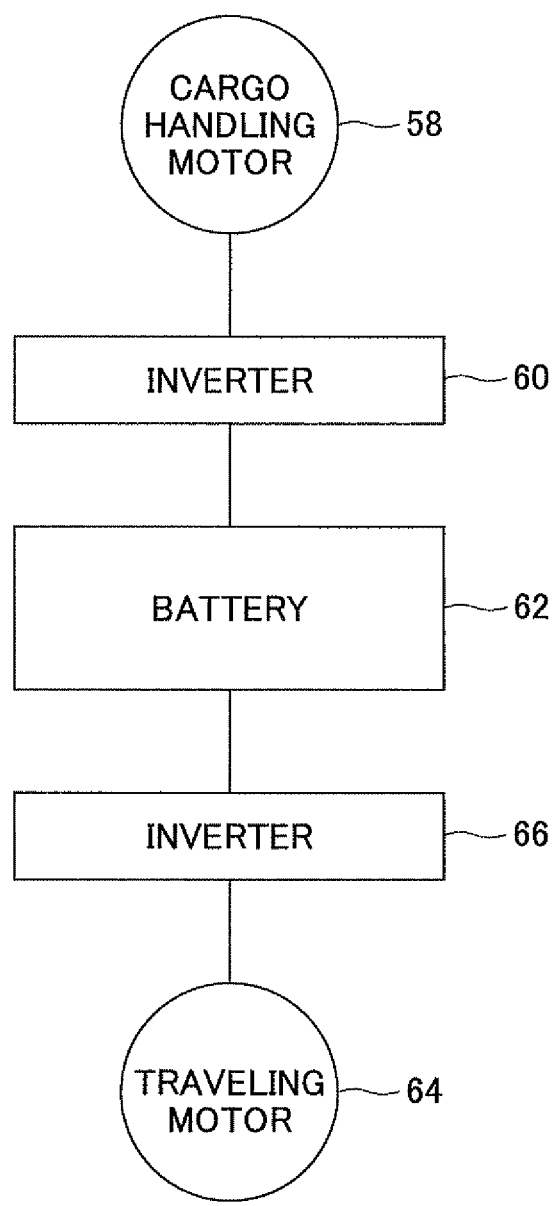
FIG. 14 is a block diagram of a drive system of the forklift illustrated in FIG. 13.

FIG. 14 is a block diagram of the drive system of the forklift illustrated in FIG. 13. A cargo handling motor 58 is connected to a battery 62 via an inverter 60. Electric power from the battery 62 is supplied to the cargo handling motor 58 via the inverter 60 to drive the cargo handling motor 58, thereby driving the forks 52. Further, a traveling motor 64 is connected to the battery 62 via an inverter 66. Electric power from the battery 62 is supplied to the traveling motor 64 via the inverter 66 to drive the traveling motor 64, thereby driving the front wheels 54 so that the forklift travels. Providing the forklift with the above-described electric power accumulation controller makes it possible to limit the charging/discharge current of the battery 62 and thereby to control the progress of the degradation of the battery 62.

Next, a description is given of a second embodiment of the present invention. In the second embodiment, charge and discharge are controlled with attention to the internal resistance correction level, resulting from changes in the internal resistance value of a capacitor due to the effect of outside air temperature, etc., as the output limit level in the above-described first embodiment.

Figure 15:
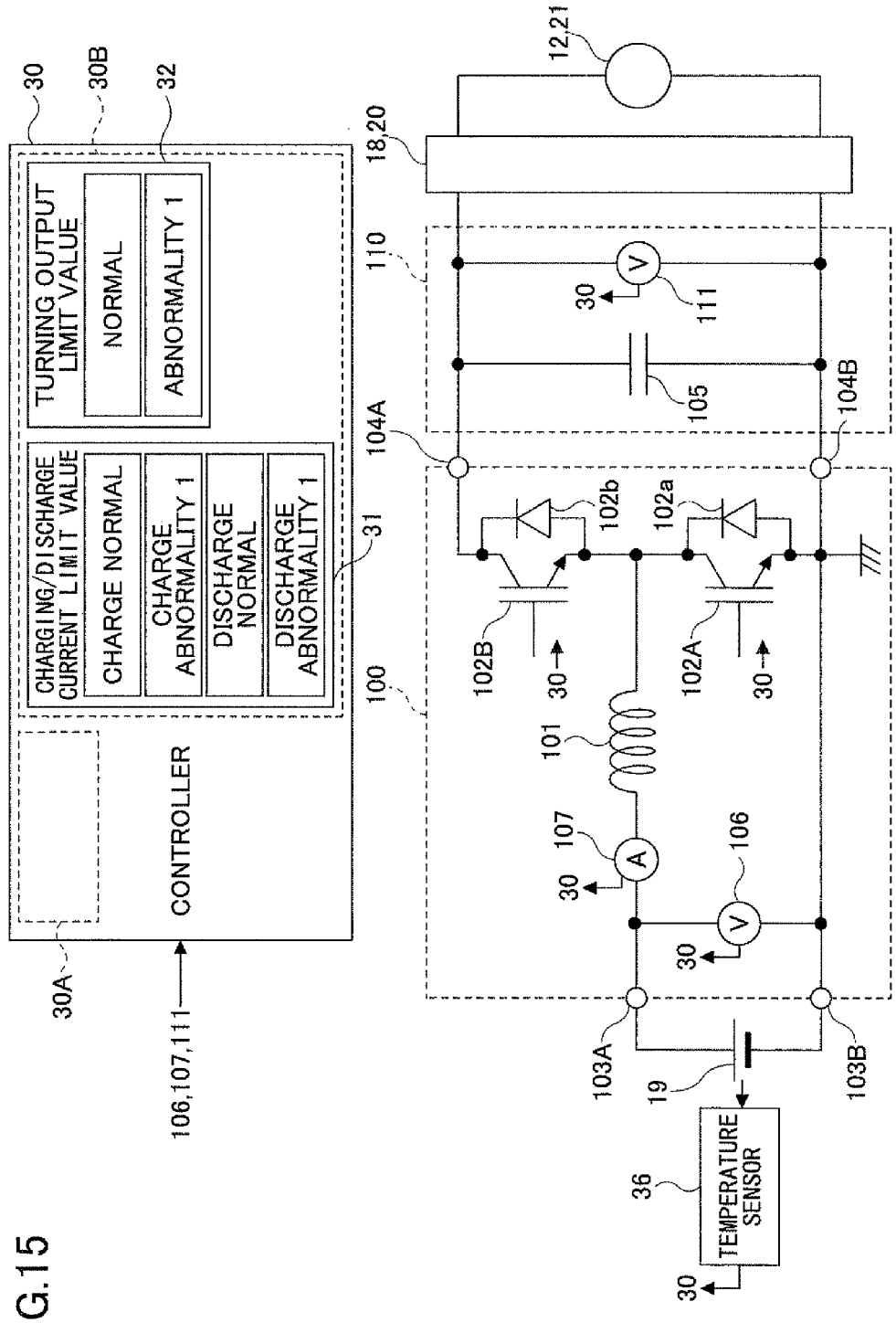
FIG. 15 is an equivalent circuit diagram of a converter.

First, a description is given in detail of the electric power accumulation system 90 used in the second embodiment. FIG. 15 is an equivalent circuit diagram of the electric power accumulation system 90. The electric power accumulation system 90 includes the capacitor 19, the step-up/step-down converter 100, and the DC bus 110. The capacitor 19 is connected to a pair of power supply connection terminals 103A and 103B of the step-up/step-down converter 100 (hereinafter simply referred to as converter 100), and the DC bus 110 is connected to a pair of output terminals 104A and 104B of the converter 100. The power supply connection terminal 103B and the output terminal 104B are grounded.

The DC bus 110 is connected to the motor generator 12 and the turning electric motor 21 via the inverters 18 and 20, respectively. The voltage generated across the DC bus 110 is measured by a voltmeter, and the measurement result is input to the controller 30.

A series circuit of a step-up insulated gate bipolar transistor (IGBT) 102A and a step-down IGBT 102B with the collector of the step-up IGBT 102A and the emitter of the step-down IGBT 102B connected to each other is connected between the output terminals 104A and 104B. The emitter of the step-up IGBT 102A is grounded, and the collector of the step-down IGBT 102B is connected to the output terminal 104A on the high voltage side. The point of interconnection of the step-up IGBT 102A and the step-down IGBT 102B is connected to the power supply connection terminal 103A on the high voltage side via a reactor 101.

Diodes 102a and 102b are connected in parallel to the step-up IGBT 102A and the step-down IGBT 102B, respectively, so that the direction from the emitter to the collector is the forward direction. A smoothing capacitor 105 is inserted between the output terminals 104A and 104B. The voltage across the terminals of the capacitor 19 is measured at a voltmeter 106 connected between the power supply connection terminals 103A and 103B. The charging/discharge current of the capacitor 19 is measured at an ammeter 107 connected in series to the reactor 101. The measurement results of voltage and current are input to the controller 30.

A temperature sensor 36 detects the temperature of the capacitor 19. The detected temperature data are input to the controller 30. The capacitor 19 includes, for example, 144 electric double layer capacitors connected in series. The temperature sensor 36 includes four thermometers provided in correspondence to four capacitors selected from the 144 electric double layer capacitors. The controller 30, for example, calculates the average of the four temperatures obtained at the four thermometers and determines the average as the temperature of the capacitor 19. In the case of determining the overheated state of the capacitor 19, the highest one of the temperatures registered by the four thermometers may be employed as the temperature of the capacitor 19. On the other hand, in the case of determining that the temperature of the capacitor 19 is excessively low, the lowest one of the temperatures registered by the four thermometers may be employed as the temperature of the capacitor 19.

The controller 30 applies a pulse width modulation (PWM) voltage for control to the gate electrodes of the step-up IGBT 102A and the step-down IGBT 102B.

The controller 30 includes the internal memory 30B. The internal memory 30B includes a charging/discharge current limit value storing part 31 and a turning output limit value storing part 32. A description is given below, with reference to FIG. 16 through FIG. 19, of the functions of the charging/discharge current limit value storing part 31 and the turning output limit value storing part 32.

A description is given below of a step-up operation (a discharge operation). The PWM voltage is applied to the gate electrode of the step-up IGBT 102A. When the step-up IGBT 102A is OFF, an induced electromotive force in a direction to cause electric current to flow from the power supply connection terminal 103A on the high voltage side to the collector of the step-up IGBT 102A is generated in the reactor 101. This electromotive force is applied to the DC bus 110 via the diode 102b. As a result, the voltage of the DC bus 110 is raised.

Next, a description is given of a step-down operation (a charge operation). The PWM voltage is applied to the gate electrode of the step-down IGBT 102B. When the step-down IGBT 102B is OFF, an induced electromotive force in a direction to cause electric current to flow from the emitter of the step-down IGBT 102B to the power supply connection terminal 103A on the high voltage side is generated in the reactor 101. The capacitor 19 is charged with this induced electromotive force. A current in a direction to discharge the capacitor 19 is determined to be positive, and a current in a direction to charge the capacitor 19 is determined to be negative.

Figure 16:
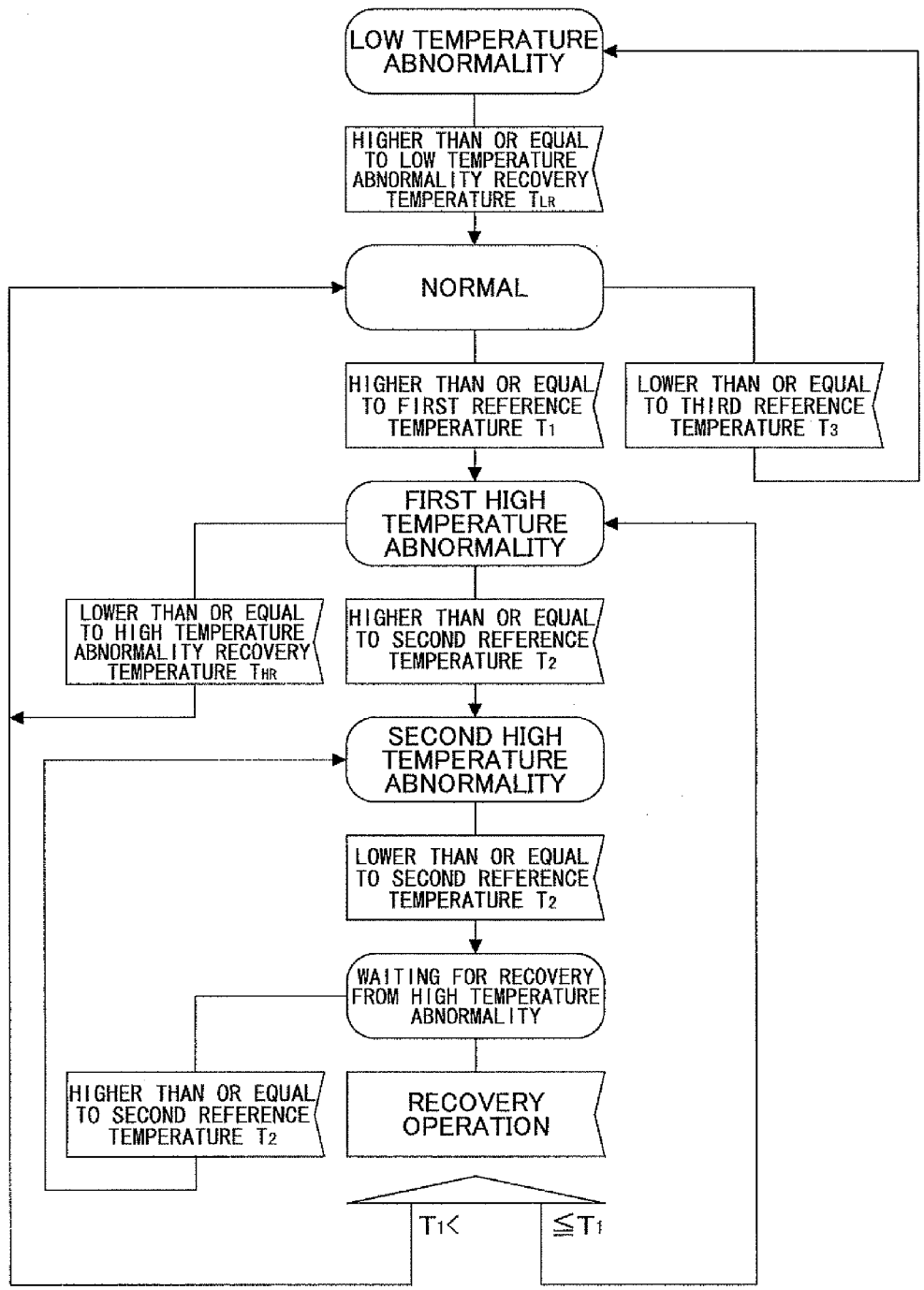
FIG. 16 is a flowchart illustrating a transition of the hybrid shovel according to a second embodiment of the present invention.

FIG. 16 is a flowchart illustrating a transition of the operating condition controlled by the controller 30. The operating condition includes multiple conditions such as normal, a low temperature abnormality, a first high temperature abnormality, a second high temperature abnormality, and high temperature abnormality recovery waiting. If the capacitor temperature becomes higher than or equal to a first reference temperature T1 during the operation in the normal condition, the operating condition changes to the first high temperature abnormality condition (LEVEL 1). If the capacitor temperature falls to a high temperature recovery temperature THR, which is lower than the first reference temperature T1, during the operation in the first high temperature abnormality condition, the operating condition returns to the normal condition.

If the capacitor temperature becomes higher than or equal to a second reference temperature T2, which is higher than the first reference temperature T1, during the operation in the first high temperature abnormality condition, the operating state changes to the second high temperature abnormality condition (LEVEL 2). If the capacitor temperature falls to the second reference temperature T2 during the operation in the second high temperature abnormality condition, the operating condition changes to the high temperature abnormality recovery waiting condition. In response to an operator's recovery command operation during the operation in the high temperature abnormality recovery waiting condition, the capacitor temperature at the moment and the first reference temperature T1 are compared in magnitude. If the capacitor temperature is higher than or equal to the first reference temperature T1, the operating condition changes to the first high temperature abnormality condition. If the capacitor temperature is less than the first reference temperature T1, the operating condition returns to the normal condition. The recovery command operation is performed with the operation apparatus 26 illustrated in FIG. 2.

If the capacitor temperature rises again to or above the second reference temperature T2 during the high temperature abnormality recovery waiting condition, the operating condition returns to the second high temperature abnormality condition.

If the capacitor temperature becomes lower than or equal to a third reference temperature T3, which is lower than the first reference temperature T1, during the operation in the normal condition, the operating condition changes to the low temperature abnormality condition. If the capacitor temperature becomes higher than or equal to a low temperature recovery temperature TLR during the operation in the low temperature abnormality condition, the operating condition returns to the normal condition.

Figure 17:
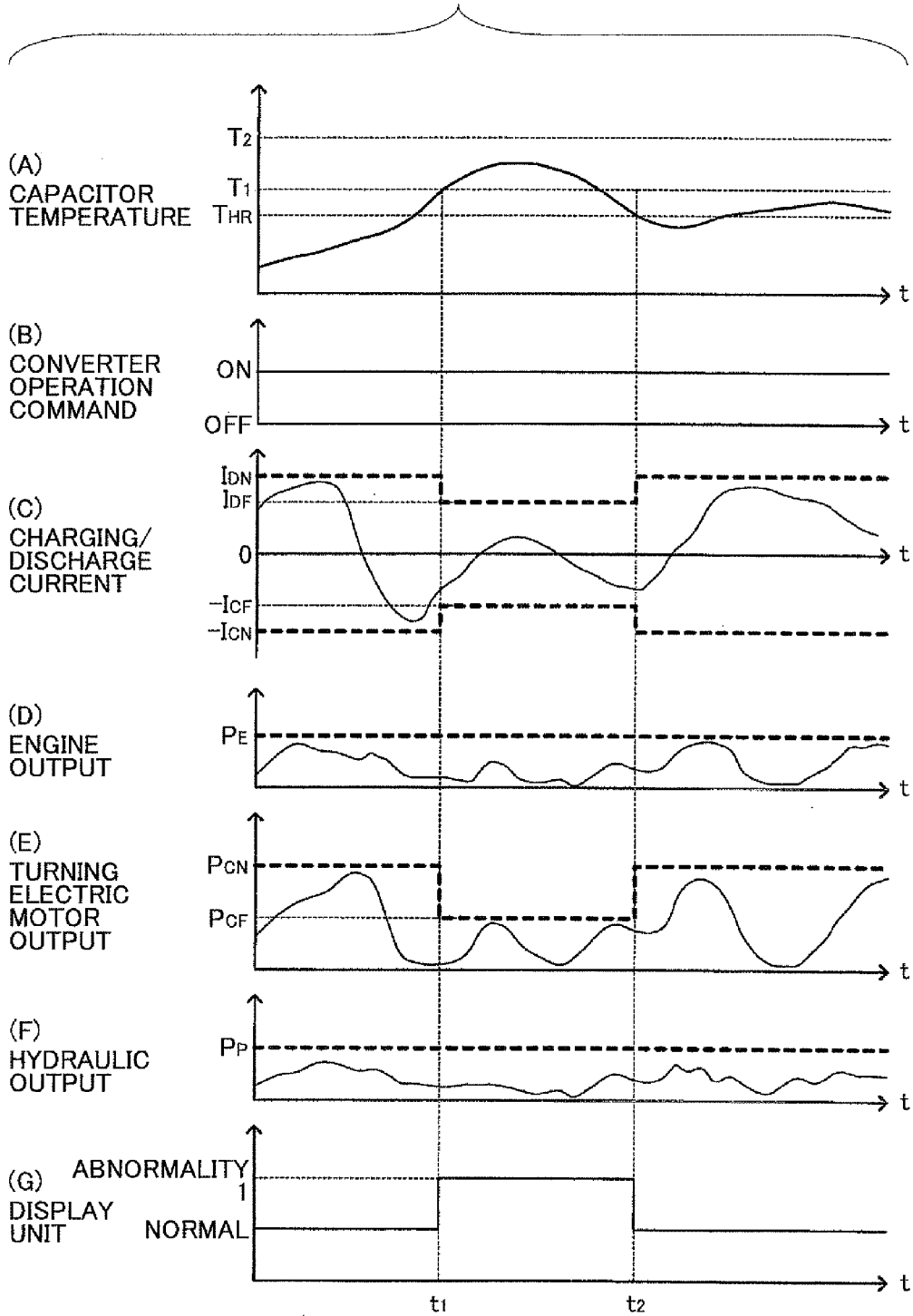
FIG. 17 is a time chart illustrating the case of changing to a first high temperature abnormality condition.

FIG. 17 is a time chart illustrating a transition of the operating condition in the case where the operating condition returns to the normal condition after changing from the normal condition to the first high temperature abnormality condition.

In FIG. 17, (A) is a graph illustrating the temperature of the capacitor 19 detected at the temperature sensor 36. With passage of time, the temperature of the capacitor 19 rises to exceed the first reference temperature T1 at Time t1. When the capacitor temperature exceeds the first reference temperature T1, the operating condition changes from the normal condition to the first high temperature abnormality condition as illustrated in FIG. 16.

The capacitor temperature falls to the high temperature abnormality recovery temperature THR at Time t2 without reaching the second reference temperature T2. At Time t2, the operating condition returns from the first high temperature abnormality condition to the normal condition. Causing the high temperature abnormality recovery temperature THR to be lower than the first reference temperature T1 makes it possible to prevent switching between the first high temperature abnormality condition and the normal condition from being repeated at short intervals. Thus, by calculating a level representing a proportion by which to limit the output of a battery with respect to each of multiple conditions related to the output of the battery, and limiting the charging/discharge current of the battery based on the calculated levels, it is possible to control the degradation of the electric power accumulator by controlling its charging/discharge current, and to stably supply electric power.

In FIG. 17, (B) is a graph illustrating the operating command condition of the converter 100, where "ON" indicates that the converter 100 is in operation, and "OFF" indicates that the converter 100 is stopped. When the converter 100 is in operation, a predetermined PWM voltage is applied to the gate electrodes of the step-up IGBT 102A and the step-down IGBT 102E illustrated in FIG. 15. When the converter 100 is stopped, the step-up IGBT 102A and the step-down IGBT 102B illustrated in FIG. 15 are constantly OFF.

In FIG. 17, (C) is a graph illustrating the charging/discharge current measured at the ammeter 107 illustrated in FIG. 15. On the vertical axis, IDF and ICF indicate abnormal-time limit values for the discharge current and the charging current, respectively, and IDN and ICN indicate normal-time limit values for discharge current and charging current, respectively. These limit values are contained in the charging/discharge current limit value storing part 31 illustrated in FIG. 15. The direction of the charging current is defined as being negative. These limit values ICN and ICF for the charging current, which represent the magnitude of current, are given a negative sign in the graph illustrated in (C) of FIG. 17. The abnormal-time limit value ICF for the charging current is smaller than the normal-time limit value ICN for the charging current. The abnormal-time limit value IDF for the discharge current is smaller than the normal-time limit value IDN for the discharge current.

The controller 30 so controls the converter 100 as to prevent the charging/discharge current from exceeding a limit value valid at present.

When the operating condition is the normal condition, that is, between Time 0 and Time t1 and at and after Time T2, the normal-time limit value IDN is valid as the limit value for the discharge current of the capacitor 19, and the normal-time limit value ICN is valid as the limit value for the charging current of the capacitor 19. The controller 30 determines which limit value to make valid. When the operating condition is the first high temperature abnormality condition, that is, during the period of Time t1 to Time t2, the high-temperature abnormal-time limit value IDF is valid as the limit value for the discharge current of the capacitor 19, and the high-temperature abnormal-time limit value ICF is valid as the limit value for the charging current of the capacitor 19.

In practice, the charging/discharge current flows in a pulse-like manner because of the induced electromotive force generated in the reactor 101 illustrated in FIG. 15. Technically, the "magnitude of charging/discharge current" means the time average of the current flowing in a pulse-like manner. In practice, the magnitude of the charging/discharge current is controlled by varying the frequency of the PWM voltage applied to the gate electrodes of the step-up IGBT 102A and the step-down IGBT 102B illustrated in FIG. 15.

By making a smaller limit value valid as the limit value for the charging/discharge current at the time of the first high temperature abnormality condition, it is possible to prevent generation of heat from the capacitor 19. This prevents a further increase in the temperature of the capacitor 19.

In FIG. 17, (D) is a graph illustrating variations in the output of the engine 11. The limit value PE of the engine 11 is the same for a normal time and a high temperature abnormality time. The controller 30 so controls the engine 11 as to prevent the output of the engine 11 from exceeding the limit value PE.

In FIG. 17, (E) is a graph illustrating variations in the output of the turning electric motor 21. On the vertical axis, PCN and PCF indicate a normal-time limit value and a high-temperature abnormal-time limit value, respectively. The high-temperature abnormal-time limit value PCF is smaller than the normal-time limit value PCN.

The controller 30 so controls the inverter 20 as to prevent the output of the turning electric motor 21 from exceeding a limit value valid at the moment. The normal-time limit value PCN is valid when the operating condition is the normal condition, and the high-temperature abnormal-time limit value PCF is valid when the operating condition is the first high temperature abnormality condition.

The turning electric motor 21 is driven with the electric power generated in the motor generator 12 and the electric power discharged from the capacitor 19. The limit value for the output of the turning electric motor 21 is low in response to the limit value for the discharge current of the capacitor 19 being low at the time of the first high temperature abnormality condition. This prevents application of an electrical overload during the generator operation of the motor generator 12.

In FIG. 17, (F) is a graph illustrating variations in the hydraulic output. The limit value PP of the hydraulic output remains constant irrespective of whether the operating condition is the normal condition or the first high temperature abnormality condition. During the period of the first high temperature abnormality condition, the output of the assist operation due to the discharge from the capacitor 19 is restricted, but necessary hydraulic output may be obtained by increasing the output of the engine 11. Therefore, the limit value PP of the hydraulic output does not have to be low even in the case of the first high temperature abnormality condition.

In FIG. 17, (G) is a graph illustrating the display condition of the display unit 35. At the time of the normal condition, "NORMAL" is displayed. At the time of the first high temperature abnormality condition, "ABNORMALITY 1" is displayed. The operator is allowed to understand a current operating condition by visually recognizing this display.

Figure 18:
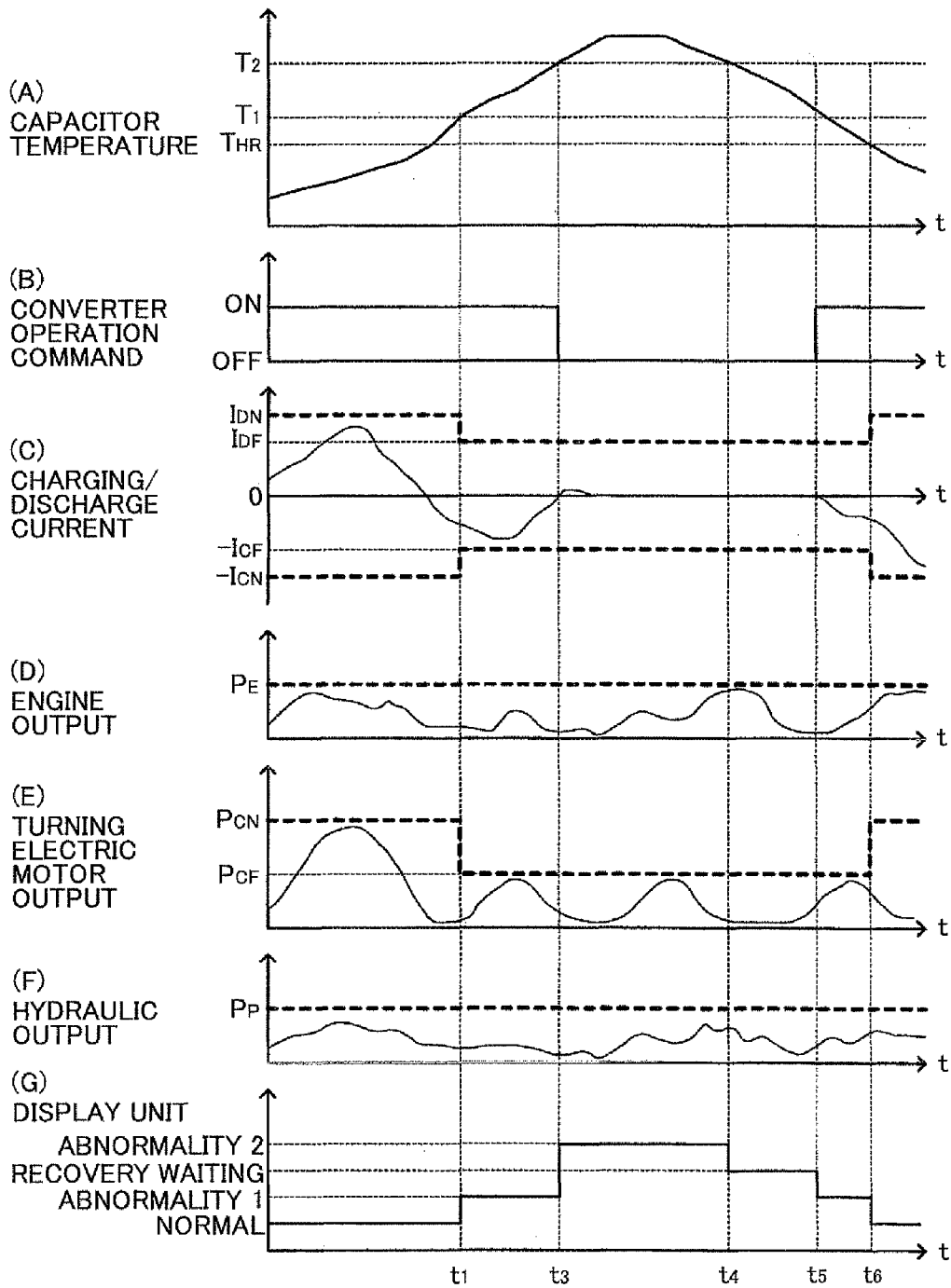
FIG. 18 is a time chart illustrating the case of changing to a second high temperature abnormality condition.

FIG. 18 is a time chart illustrating a transition of the operating condition in the case where the operating condition reaches the second high temperature abnormality condition. In FIG. 18, (A) through (G) are graphs of the capacitor temperature, the converter operation command, the charging/discharge current, the engine output, the turning electric motor output, the hydraulic output, and the display unit output, respectively, the same as in FIG. 17. At Time t1, the capacitor temperature exceeds the first reference temperature T1 so that the operating condition changes to the first high temperature abnormality condition. Thereafter, at Time t3, the capacitor temperature exceeds the second reference value T2 so that the operating condition changes to the second high temperature abnormality condition.

When the operating condition becomes the second high temperature abnormality condition, the converter operation command becomes "OFF." That is, the step-up IGBT 102A and the step-down IGBT 102B illustrated in FIG. 15 become constantly OFF. Therefore, there is no performance of forcible charge and discharge based on the induced electromotive force of the reactor 101. If the voltage between the output terminals 104A and 104B becomes lower than the voltage across the terminals of the capacitor 19, the discharge current of the capacitor 19 flows through the diode 102b.

The valid limit values IDF and ICF at the time of the first high temperature abnormality condition are maintained as the limit values for the charging current and the discharge current. However, since the converter operation command is "OFF," the charging/discharge current hardly flows.

The limit value PE for the engine output and the limit value PP for the hydraulic output are the same as the limit values at the time of the normal condition. The limit value PCF at the time of the first high temperature abnormality condition is maintained as the limit value for the output of the turning electric motor 21. Since there is no forced discharge from the capacitor 19, the turning electric motor 21 is driven with the electric power generated by the generator operation of the motor generator 12. Further, the motor generator 12 does not perform the assist operation.

In the second high temperature abnormality condition, "ABNORMALITY 2" is displayed on the display unit 35. In the second high temperature abnormality condition, the capacitor 19 is hardly charged or discharged. Therefore, an increase in the temperature of the capacitor 19 is suppressed, and further, the temperature of the capacitor 19 starts to decrease.

When the temperature of the capacitor 19 becomes lower than or equal to the second reference temperature T2 at Time t4, the operating condition changes to the high temperature abnormality recovery waiting condition as illustrated in FIG. 16. At this point, "WAITING FOR RECOVERY" is displayed on the display unit 35.

When the operator performs a recovery command operation at Time t5, the converter operation command is turned ON and the operating condition changes. In FIG. 18, the capacitor temperature at the time of the recovery command operation is higher than or equal to the first reference temperature T1. Therefore, the operating condition changes to the first high temperature abnormality condition. If the capacitor temperature at the time of the recovery command operation is lower than the first reference temperature T1, the operating condition changes to the normal condition as illustrated in FIG. 16. When the capacitor temperature becomes lower than or equal to the high temperature abnormality recovery temperature THR at Time t6, the operating condition returns to the normal condition.

Since the capacitor 19 is not forced to be charged or discharged at the time of the second high temperature abnormality condition, it is possible to prevent a further increase in the temperature of the capacitor 19. This makes it possible to control the degradation of the capacitor 19.

Figure 19:
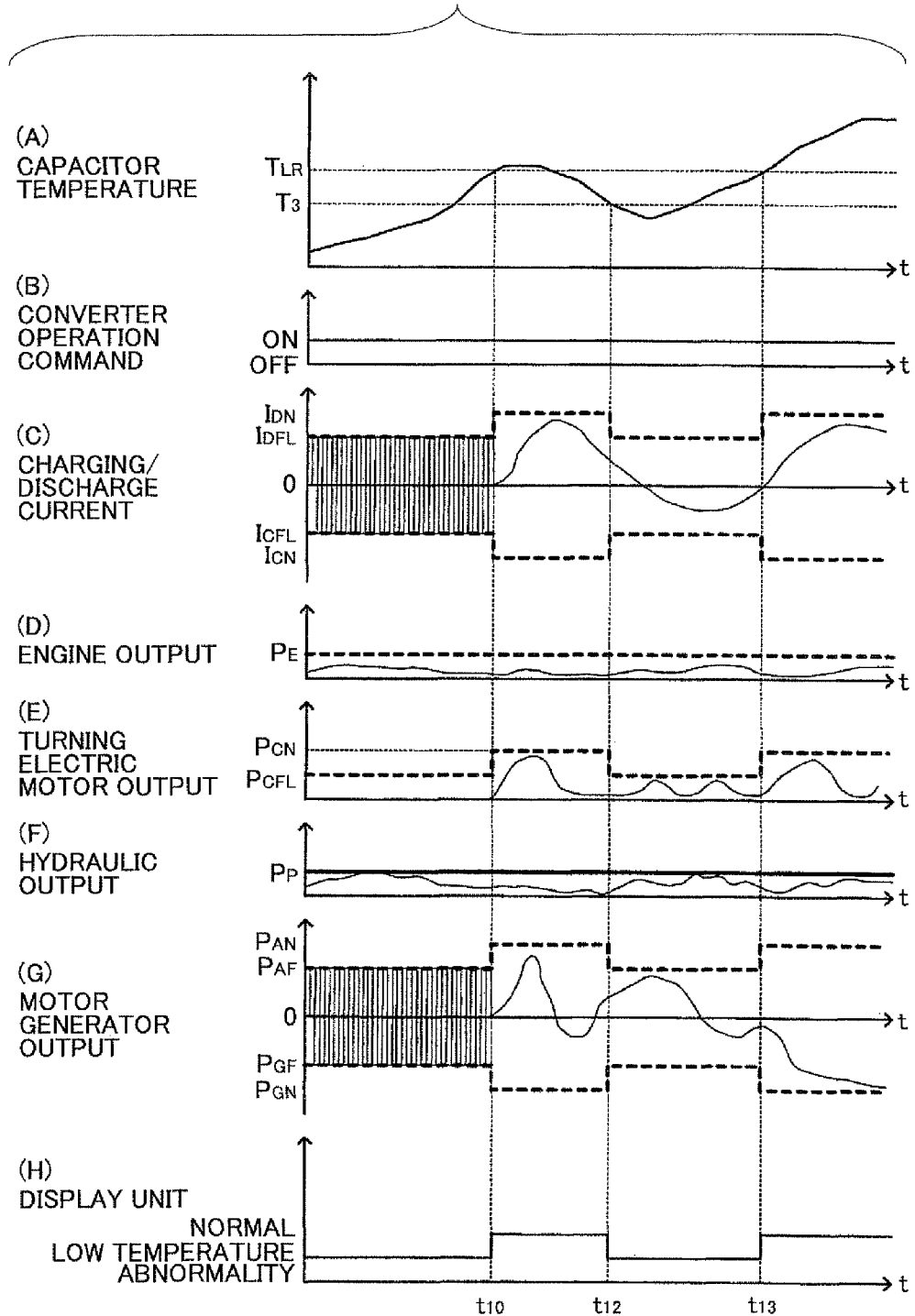
FIG. 19 is a time chart illustrating the case of changing to a low temperature abnormality condition.

FIG. 19 is a time chart illustrating a transition of the operating condition in the case where the operating condition reaches the low temperature abnormality condition. In FIG. 19, (A) through (H) are graphs of the capacitor temperature, the converter operation command, the charging/discharge current, the engine output, the turning electric motor output, the hydraulic output, the motor generator output, and the display unit output, respectively.

It is assumed that the capacitor temperature at the start of operation is lower than or equal to a third reference temperature T3. At this point, the operating condition is the low temperature abnormality condition. The converter operation command is turned ON. On the vertical axis of the graph of the charging/discharge current, ICFL and IDFL indicate a low-temperature-time limit value for the charging current and a low-temperature-time limit value for the discharge current, respectively. The low-temperature-time limit value for the charging current ICFL is smaller than the normal-time limit value for the charging current ICN. The low-temperature-time limit value for the discharge current IDFL is smaller than the normal-time limit value for the discharge current IDN. At the time of the low temperature abnormality condition, the limit values ICFL and IDFL for the low temperature abnormality time are made valid.

In the chart of the turning electric motor output, PCFL on the vertical axis indicates an output limit value in the low temperature abnormality condition. At the time of the low temperature abnormality condition, the low-temperature-time output limit value PCFL is made valid. On the display unit 35, "LOW TEMPERATURE ABNORMALITY" is displayed.

In the chart indicating the motor generator output, PAF and PGF on the vertical axis indicate an assist operation output limit value and a generator operation output limit value, respectively, in the low temperature abnormality condition. On the vertical axis, PAN and PGN indicate an assist operation output limit value and a generator operation output limit value, respectively, in the normal condition. The controller 30 controls the inverter 18 so that the assist operation and the generator operation are performed without exceeding respective limit values valid at present.

When the turning electric motor 21 is not driven in the low temperature abnormality condition, the low-temperature-abnormality-time limit values PAF and PGF are made valid, and the controller 30 controls the inverter 18 so that the assist operation and the generator operation are alternately repeated. Since there is no supply of electric power to the turning electric motor 21 or extraction of regenerated electric power from the turning electric motor 21, discharge current flows through the capacitor 19 at the time of the assist operation of the motor generator 12, and charging current flows through the capacitor 19 at the time of the generator operation of the motor generator 12. The charging current and the discharge current cause heat to be generated in the capacitor 19. This makes it possible to increase the temperature of the capacitor 19.

When the capacitor temperature becomes higher than or equal to the low temperature abnormality recovery temperature TLR, which is higher than the third reference temperature T3, at Time t10, the operating condition changes to the normal condition. The normal-time limit values IDN and ICN are made valid as the limit values for the charging current and the discharge current, respectively, the normal-time limit value PCN is made valid as the limit value for the turning electric motor output, and the normal-time limit values PAN and PGN are made valid as the limit values for the assist operation output and the generator operation output, respectively, of the motor generator output. The operation of the motor generator 12 also returns to the operation in the normal condition. That is, the assist operation and the generator operation are switched in accordance with the load.

When the capacitor temperature becomes lower than or equal to the third reference temperature T3 for some reason at Time t12, the operating condition changes to the low temperature abnormality condition. The limit values for the low temperature abnormality time are made valid as the respective limit values. The assist operation and the generator operation of the motor generator 12 are switched in accordance with the operation of the turning electric motor 12 and the charge and discharge operation of the capacitor 19. By lowering the limit values for the charging current and the discharge current, it is possible to prevent a large electric current from flowing through the capacitor 19 with its internal resistance being high.

When the capacitor temperature becomes higher than or equal to the low temperature abnormality recovery temperature TLR at Time t13, the operating condition returns to the normal condition.

In this embodiment, a description is given of the case where the operation command of the converter 100 is "ON" at the time of the normal condition, while the operation command of the converter 100 may be "OFF" at the time of the normal condition. In this case as well, the respective limit values are made valid in accordance with the operating condition the same as in the above-described embodiment.

When the operation command of the converter 100 is "OFF," discharge current may flow from the capacitor 19 via the diode 102b illustrated in FIG. 15. The magnitude of this discharge current is controlled by limiting the total value of the outputs of the motor generator 12 and the turning electric motor 21 illustrated in FIG. 2. Specifically, the upper limit value of the total output of the motor generator 12 and the turning electric motor 21 is determined by calculations so that the magnitude of the discharge current flowing through the converter 100 falls within the range defined by a limit value valid at the moment. The inverters 18 and 20 are so controlled as to prevent the total output of the motor generator 12 and the turning electric motor 21 from exceeding this upper limit value.

In the above-described embodiments, a shovel in which the turning electric motor 21 is caused to perform a regenerative operation is described as a hybrid working machine. The methods of controlling the electric power accumulation system 90 described in the above-described embodiments may also be applied to cranes provided with a drive unit for hoisting. In this case, the potential energy of an object of hoisting is converted into electrical energy. The generated electrical energy is stored in the capacitor 19. At the time of a hoisting operation, a hoisting electric motor is driven with discharge current from the capacitor 19 and generated electric power from the motor generator 12.

Further, the methods of controlling the electric power accumulation system 90 described in the above-described embodiments may also be applied to working machines of a lifting magnet type. In this case, attraction and adhesion to a lifting magnet is caused by discharge current from the capacitor 19.

The present invention is not limited to the specifically disclosed embodiments, and variations and modifications may be made without departing from the scope of the present invention.

The present invention is based on Japanese Priority Patent Application No. 2009-016133, filed on Jan. 28, 2009, and Japanese Priority Patent Application No. 2009-035779, filed on Feb. 18, 2009, the entire contents of which are incorporated herein by reference.

INDUSTRIAL APPLICABILITY

The present invention may be applied to hybrid working machines.

DESCRIPTION OF THE REFERENCE NUMERALS

1 lower-part traveling body (base body)
1A, 1B hydraulic motor
2 turning mechanism
3 upper-part turning body
4 boom
5 arm
6 bucket
7 boom cylinder
8 arm cylinder
9 bucket cylinder
10 cabin
11 engine
12 motor generator (second electric motor)
13 transmission
14 main pump
15 pilot pump
16 high-pressure hydraulic line
17 control valve
18 inverter (second electric circuit)
19 capacitor (battery)
20 inverter (first electric circuit)
21 turning electric motor (first electric motor)
23 mechanical brake
24 transmission
25 pilot line
26 operation apparatus
27, 28 hydraulic line
29 pressure sensor
30 controller
35 display unit
36 temperature sensor
40a individual level calculating part
40b final level calculating part
40c limit proportion calculating part
40d electric current calculating part
50 driver's seat
52 forks
54 front wheels
56 rear wheels
58 cargo handling motor
60, 66 inverter
62 battery
64 traveling motor
100 step-up/step-down converter (capacitor charge and discharge circuit)
101 reactor
102A step-up IGBT
102B step-down IGBT
102a, 102b diode
103A, 103B power supply connection terminal
104A, 104B output terminal
105 smoothing capacitor
106 voltmeter
107 ammeter
110 DC bus
111 voltmeter

The invention claimed is:

1. A hybrid working machine, comprising:
a first electric motor configured to perform a power running operation of being driven with supplied electric power and a regenerative operation of generating electric power;
a first electric circuit configured to control an output of the first electric motor;
an electric power accumulator configured to supply the first electric motor with the electric power and to store the regenerated electric power from the first electric motor;
a charge and discharge circuit configured to control a charging current and a discharge current of the electric power accumulator; and
a controller configured to control charge and discharge of the electric power accumulator for driving the machine,
wherein the controller is configured to calculate a level representing a proportion by which an output of the electric power accumulator is limited with respect to each of multiple conditions related to the output of the electric power accumulator, and to limit the charging current and the discharge current of the electric power accumulator based on the calculated levels, and wherein control information related to the multiple conditions includes information representing outside air temperature, information representing a setting of an operating condition of the machine, information representing degradation of the electric power accumulator, and information representing a failure condition of the machine.

2. The hybrid working machine as claimed in claim 1, wherein the controller is configured to calculate the level independently with respect to each of the multiple conditions, and to limit the charging current and the discharge current of the electric power accumulator based on an output limit level determined by summing up the calculated levels.

3. The hybrid working machine as claimed in claim 2, wherein the controller is configured to control the charging current and the discharge current of the electric power accumulator at present based on limit values calculated by multiplying an initially set maximum charging current and an initially set maximum discharge current by an output coefficient corresponding to the output limit level.

4. The hybrid working machine as claimed in claim 1, wherein the controller comprises:
an individual level calculating part configured to calculate the level independently with respect to each of the multiple conditions;
a final level calculating part configured to determine an output limit level by summing up the calculated levels;
a limit proportion calculating part configured to calculate an output coefficient corresponding to the output limit level; and
an electric current calculating part configured to calculate a discharge current for output limiting by multiplying a preset initial discharge current for output limiting by the output coefficient, and to calculate a charging current for input limiting by multiplying a preset initial charging current for input limiting by the output coefficient.

5. A hybrid working machine, comprising:
a first electric motor configured to perform a power running operation of being driven with supplied electric power and a regenerative operation of generating electric power;
a first electric circuit configured to control an output of the first electric motor;
an electric power accumulator configured to supply the first electric motor with the electric power and to store the regenerated electric power from the first electric motor;
a charge and discharge circuit configured to control a charging current and a discharge current of the electric power accumulator;
a temperature sensor configured to detect a temperature of the electric power accumulator; and
a controller configured to control charge and discharge of the electric power accumulator for driving the machine,
wherein the controller is configured to have data on the temperature detected at the temperature sensor input thereto, and to control the charge and discharge circuit so as to prevent the charging current and the discharge current of the electric power accumulator from exceeding respective second limit values smaller than first limit values, the first limit values being limit values for a normal time, in response to the temperature detected at the temperature sensor becoming higher than or equal to a first reference temperature.

6. The hybrid working machine as claimed in claim 5, wherein the controller is configured to further control the first electric circuit so as to prevent the output of the first electric motor from exceeding a fourth limit value smaller than a third limit value, in response to the temperature detected at the temperature sensor becoming higher than or equal to the first reference temperature, the third limit value being a limit value for the normal time.

7. The hybrid working machine as claimed in claim 5, further comprising:
a turning body attached to a body of the working machine in a turnable manner,
wherein the first electric motor is configured to generate a rotating driving force to turn the turning body.

8. The hybrid working machine as claimed in claim 5, wherein the controller is configured to return limit values for the charging current and the discharge current of the electric power accumulator to the values for the normal time and control the charge and discharge circuit, in response to the temperature detected at the temperature sensor becoming lower than or equal to a first recovery temperature lower than the first reference temperature.

9. The hybrid working machine as claimed in claim 5, wherein the controller is configured to control the charge and discharge circuit so as to stop charging the electric power accumulator and forcibly discharging the electric power accumulator, in response to the temperature detected at the temperature sensor becoming higher than or equal to a second reference temperature higher than the first reference temperature.

10. The hybrid working machine as claimed in claim 5, wherein the controller is configured to control the charge and discharge circuit so as to prevent the charging current and the discharge current of the electric power accumulator from exceeding respective fifth limit values lower than first limit values for the normal time, and to control the first electric circuit so as to prevent the output of the first electric motor from exceeding a sixth limit value smaller than a seventh limit value, the seventh limit value being a limit value for the normal time, in response to detecting the temperature detected at the temperature sensor becoming lower than or equal to a third reference temperature lower than the first reference temperature.

11. The hybrid working machine as claimed in claim 10, further comprising:
an engine configured to generate a driving force with a fuel other than electricity;
a second electric motor mechanically connected to a drive shaft of the engine and electrically connected to the electric power accumulator, the second electric motor being configured to perform a generator operation of generating electric power by being driven by the engine and to perform an assist operation of assisting the driving force of the engine by generating a mechanical driving force by being supplied with electric power from the electric power accumulator; and
a second electric circuit configured to switch a state of supplying the second electric motor with the electric power and a state of extracting the generated electric power from the second electric motor,
wherein the controller is configured to control the second electric circuit so that the second electric motor alternately repeats the generator operation and the assist operation, in response to the temperature detected at the temperature sensor becoming less than or equal to the third reference temperature.

* * * * *